(12) United States Patent
Choi et al.

(10) Patent No.: US 11,940,849 B2
(45) Date of Patent: Mar. 26, 2024

(54) DISPLAY DEVICE INCLUDING MODULE SUPPORT AND METHOD FOR MANUFACTURING MODULE SUPPORT

(71) Applicant: SAMSUNG DISPLAY CO., LTD., Yongin-si (KR)

(72) Inventors: Jin Hwan Choi, Seoul (KR); Hayk Khachatryan, Hwaseong-si (KR); Hyunwoo Koo, Hwaseong-si (KR); Dongwon Choi, Seoul (KR); Taewoong Kim, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 72 days.

(21) Appl. No.: 17/629,578

(22) PCT Filed: Dec. 11, 2019

(86) PCT No.: PCT/KR2019/017419
§ 371 (c)(1),
(2) Date: Jan. 24, 2022

(87) PCT Pub. No.: WO2021/071024
PCT Pub. Date: Apr. 15, 2021

(65) Prior Publication Data
US 2022/0269312 A1    Aug. 25, 2022

(30) Foreign Application Priority Data

Oct. 7, 2019 (KR) .......................... 10-2019-0123820

(51) Int. Cl.
*G06F 1/16* (2006.01)

(52) U.S. Cl.
CPC .......... *G06F 1/1656* (2013.01); *G06F 1/1652* (2013.01)

(58) Field of Classification Search
CPC .................................................... G06F 1/1652
See application file for complete search history.

(56) References Cited

U.S. PATENT DOCUMENTS 5,448,131 A     9/1995  Taylor et al.
7,639,237 B2 *  12/2009 Perkins .................... G09F 9/301
                                                         345/173

(Continued)

FOREIGN PATENT DOCUMENTS

CN    107067975 A    8/2017
CN    107492310 A    12/2017

(Continued)

OTHER PUBLICATIONS

International Search Report dated Jul. 6, 2020 for PCT/KR2019/017419.

(Continued)

*Primary Examiner* — Lisa Lea-Edmonds
(74) *Attorney, Agent, or Firm* — CANTOR COLBURN LLP

(57) ABSTRACT

A display device includes a display module, a module support disposed below the display module, and a housing which receives the display module and the module support. The module support includes: a support layer disposed below the display module, and a plurality of support bars disposed in the support layer and having a modulus greater than a modulus of the support layer.

22 Claims, 23 Drawing Sheets

(56) References Cited

U.S. PATENT DOCUMENTS

| | | | |
|---|---|---|---|
| 9,019,696 | B2 | 4/2015 | Hamers et al. |
| 9,069,521 | B2 | 6/2015 | Lee et al. |
| 9,817,443 | B2* | 11/2017 | Kim .................... G06F 1/1652 |
| 9,844,152 | B2 | 12/2017 | Heo et al. |
| 9,940,892 | B2 | 4/2018 | Pang |
| 10,008,695 | B2 | 6/2018 | Park et al. |
| 10,019,036 | B2 | 7/2018 | Sun |
| 10,074,824 | B2 | 9/2018 | Han et al. |
| 10,175,792 | B2* | 1/2019 | Kim .................... G06F 1/1652 |
| 10,289,164 | B2 | 5/2019 | Seo et al. |
| 10,345,856 | B2 | 7/2019 | Song |
| 10,466,748 | B2* | 11/2019 | Choi .................... G09F 9/301 |
| 10,671,124 | B2* | 6/2020 | Kim .................... H05K 5/0017 |
| 10,684,652 | B2 | 6/2020 | Kim et al. |
| 10,827,630 | B2 | 11/2020 | Kim et al. |
| 11,140,790 | B2* | 10/2021 | Kim .................... H04B 1/3877 |
| 2010/0177020 | A1 | 7/2010 | Bemelmans et al. |
| 2011/0018820 | A1 | 1/2011 | Huitema et al. |
| 2012/0212433 | A1 | 8/2012 | Lee et al. |
| 2012/0314399 | A1 | 12/2012 | Bohn et al. |
| 2015/0102712 | A1 | 4/2015 | Sim et al. |
| 2016/0064685 | A1 | 3/2016 | Kim |
| 2017/0278436 | A1* | 9/2017 | Chu .................... H10K 77/111 |
| 2019/0064881 | A1 | 2/2019 | Kim et al. |
| 2021/0272486 | A1* | 9/2021 | Khachatryan ......... G06F 1/1652 |
| 2022/0327970 | A1* | 10/2022 | Park .................... G09F 9/301 |
| 2022/0357775 | A1* | 11/2022 | Choi .................... G06F 1/1656 |
| 2023/0232553 | A1* | 7/2023 | Ahn .................... H05K 5/0217 |
| | | | 361/535 |
| 2023/0244279 | A1* | 8/2023 | Kim .................... G06F 1/1624 |
| | | | 361/679.02 |

FOREIGN PATENT DOCUMENTS

| | | | |
|---|---|---|---|
| CN | 108122502 | A | 6/2018 |
| JP | WO2010071009 | A1 | 5/2012 |
| JP | 201945855 | A | 3/2019 |
| KR | 1020110039217 | A | 4/2011 |
| KR | 101273182 | B1 | 6/2013 |
| KR | 1020150115122 | A | 10/2015 |
| KR | 1020160025152 | A | 3/2016 |
| KR | 1020160098667 | A | 8/2016 |
| KR | 1020160098677 | A | 8/2016 |
| KR | 1020170019043 | A | 2/2017 |
| KR | 1020170062343 | A | 6/2017 |
| KR | 1020170110221 | A | 10/2017 |
| KR | 1020170124120 | A | 11/2017 |
| KR | 1020180036904 | A | 4/2018 |
| WO | 2008054206 | A2 | 5/2008 |
| WO | 2009148313 | A1 | 12/2009 |

OTHER PUBLICATIONS

M. S. Sutton et al., "Micromachined Negative Thermal Expansion Thin Films," The 12th International Conference on Solid State Sensors, Acluators and Microsystems, Boston, Jun. 8-12, 2003, pp. 1148-1151.

M. S. Sutton et al., "Zirconium Tungstate (ZrW2O8)-Based Micromachined Negative Thermal-Expansion Thin Films," Journal of Microelectromechanical Systems, 2004, pp. 688-695, vol. 13, No. 4.

Extended European Search Report for Application No. 19948540.0-1224 dated Feb. 6, 2024.

Schirber, Michael, Strange Shrinking Material, Live Science, Published Dec. 15, 2004, pp. 1-4, https://www.livescience.com/3749-strange-shrinking-material.html.

* cited by examiner

FIG. 1
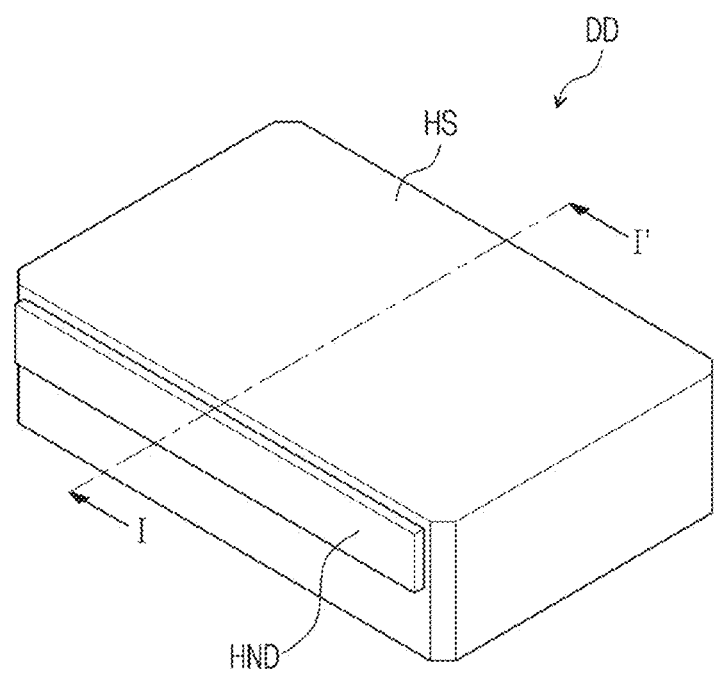
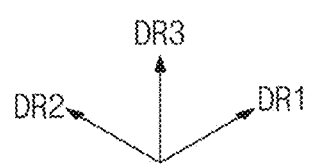

FIG. 2
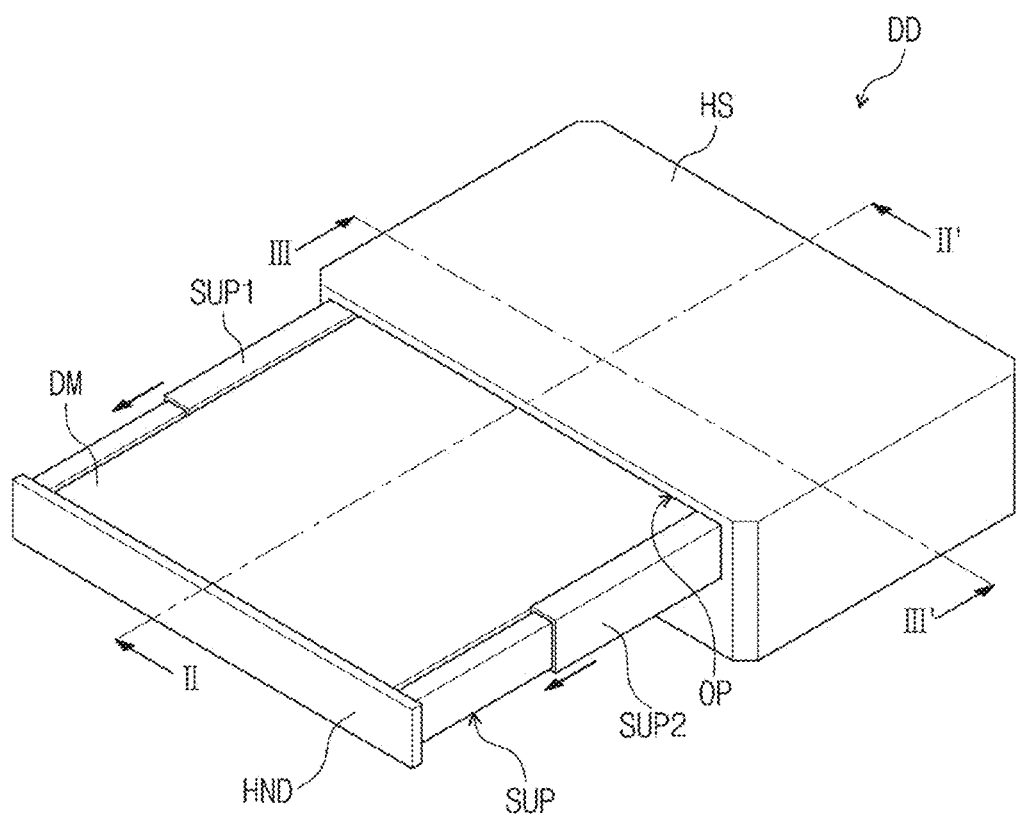
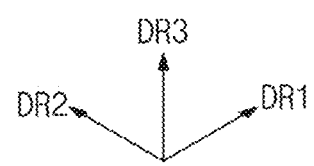

FIG. 3
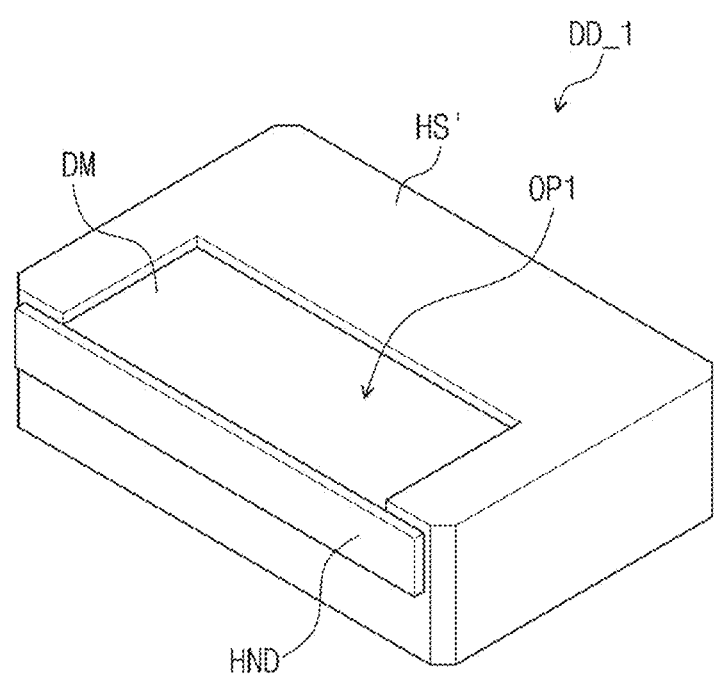
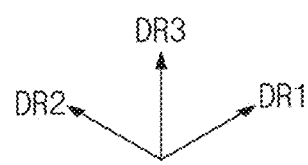

FIG. 10
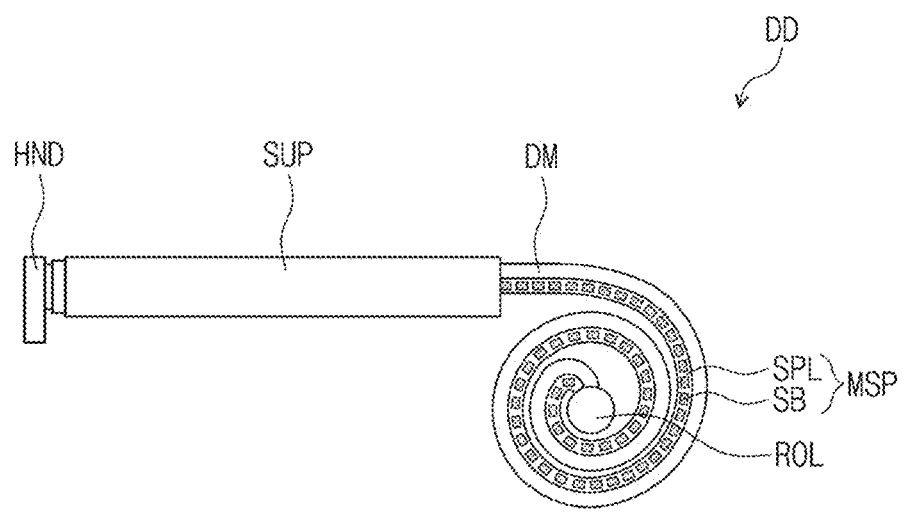
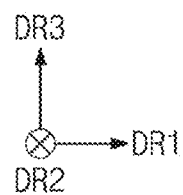

FIG. 14
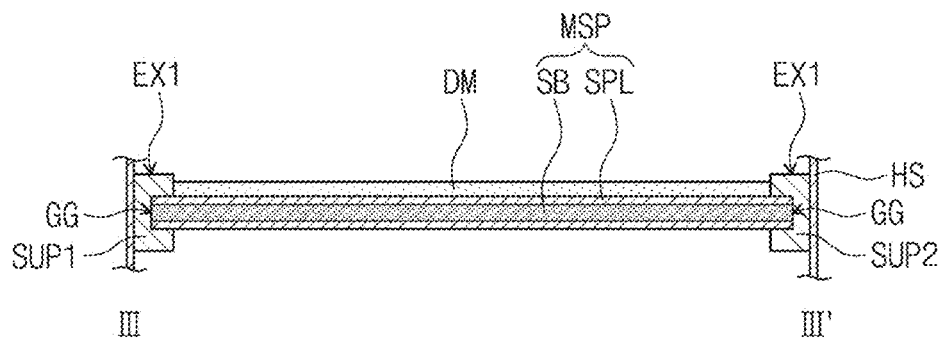
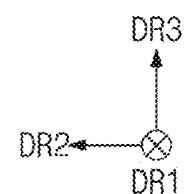
FIG. 15
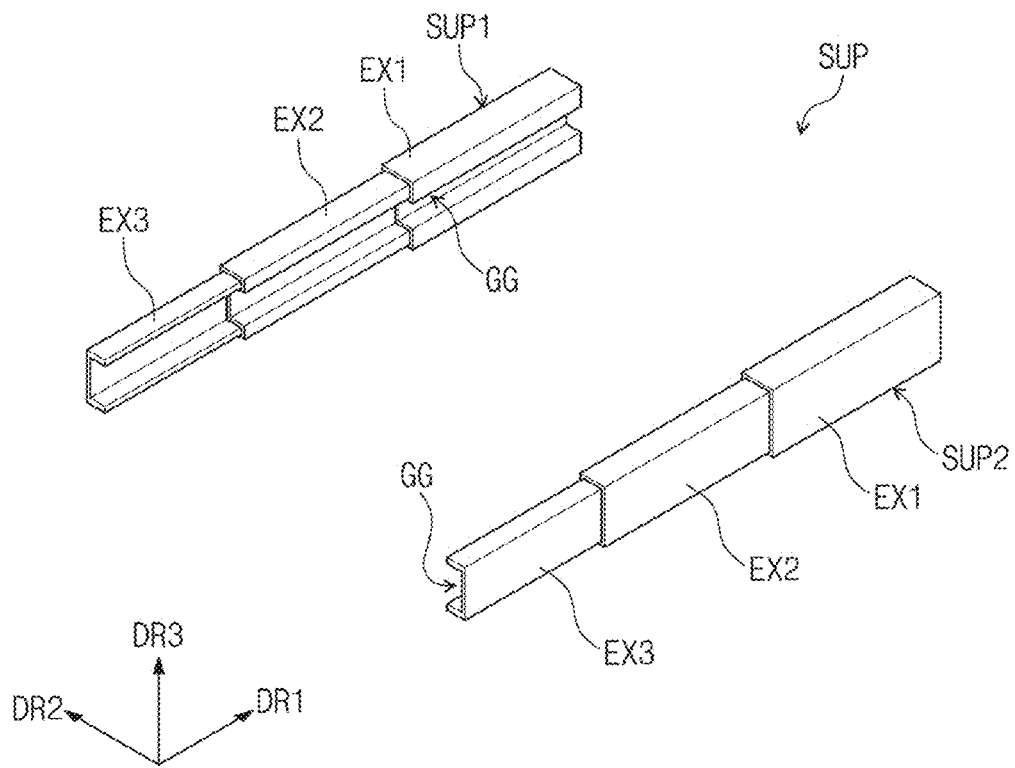

FIG. 16
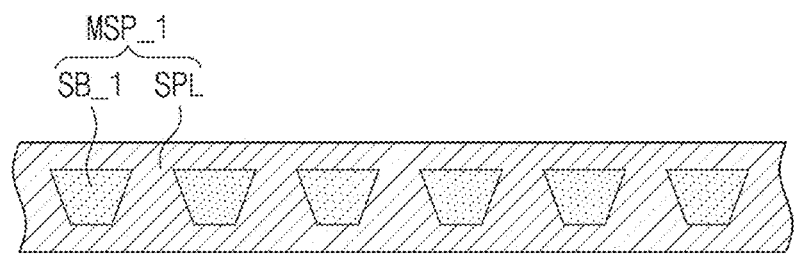
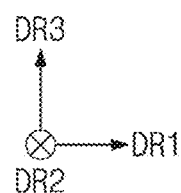
FIG. 17
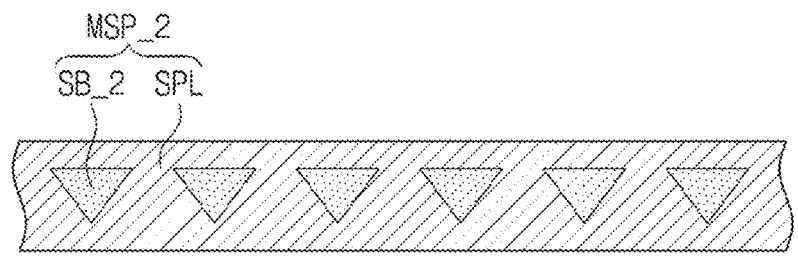
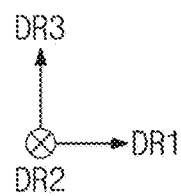
FIG. 18
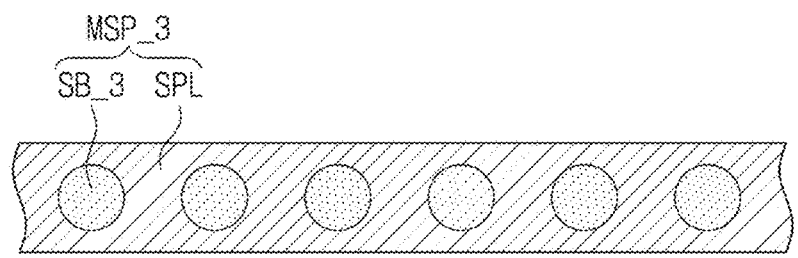
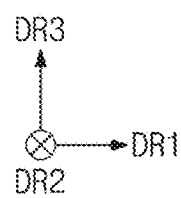

DISPLAY DEVICE INCLUDING MODULE SUPPORT AND METHOD FOR MANUFACTURING MODULE SUPPORT

TECHNICAL FIELD

The present invention relates to a display device including a module support and a method for manufacturing the module support.

BACKGROUND ART

An electronic device which provides images to a user, such as a smart phone, a digital camera, a notebook computer, a navigation system, and a smart television, includes a display device for displaying the images. The display device generates images, and provides the images to a user through a display screen.

Display devices of various shapes are being developed. For example, various flexible display devices which may be deformed into a shape having a curved surface, folded, or rolled are being developed. Flexible display devices are easy to carry around, and may improve user convenience.

Among the flexible display devices, a rollable display device includes a display module, a roller on which the display module is wound, and a housing receiving the display module and the roller. The roller may rotate to allow the display module to be drawn out of the housing or may be drawn into the housing.

DISCLOSURE OF THE INVENTION

Technical Problem

An aspect of the present invention is to provide a display device including a module support which may improve the surface quality of a display module, and a method for manufacturing the module support.

Technical Solution

A display device according to an embodiment of the present invention includes: a display module, a module support disposed below the display module, and a housing which receives the display module and the module support. The module support includes: a support layer disposed below the display module, and a plurality of support bars disposed in the support layer and having a modulus greater than a modulus of the support layer.

A display device according to an embodiment of the present invention includes: a display module and a module support disposed below the display module. The module support includes: a support layer disposed below the display module, and a plurality of support bars arranged in a first direction in the support layer. The support layer includes a material having a negative coefficient of thermal expansion.

Advantageous Effects

According to an embodiment of the present invention, a module support disposed below a display module includes a support layer providing a flat upper surface to the display module and a plurality of support bars disposed in the support layer and having a modulus greater than a modulus of the support layer. The support bars support the display module, and the support layer provides a flat upper surface to the display module, so that the surface quality of the display module may be effectively improved.

BRIEF DESCRIPTION OF THE DRAWINGS

FIG. 1 is a perspective view of a display device according to an embodiment of the present invention;

FIG. 2 is a view illustrating a state that a display module of the embodiment of FIG. 1 is drawn out of a housing thereof;

FIG. 3 and FIG. 4 are perspective views of a display device according to another embodiment of the present invention;

FIG. 10 is an internal side view of a housing illustrated in FIG. 1 of which inside is viewed in a second direction;

FIG. 14 is a cross-sectional view of line illustrated in FIG. 2;

FIG. 15 is a perspective view of a support illustrated in FIG. 13;

FIG. 16 to FIG. 19 are views illustrating components of module supports according to various embodiments of the present invention;

MODE FOR CARRYING OUT THE INVENTION

Figure 4:
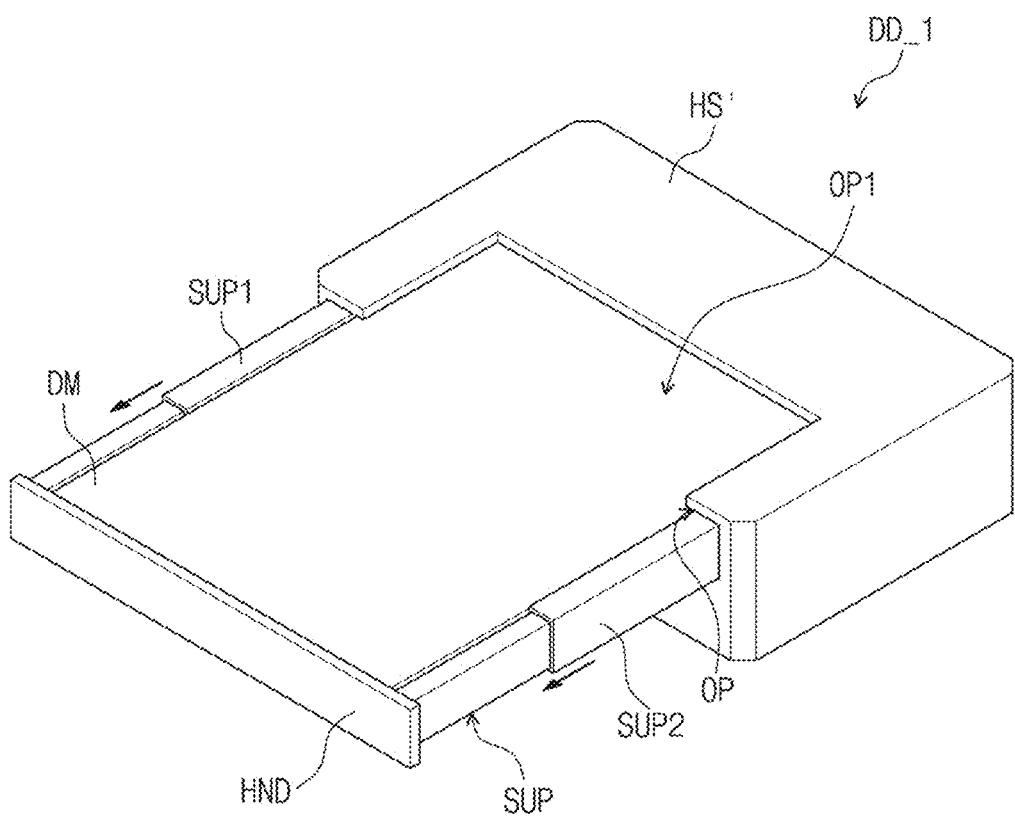

In the present disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements are exaggerated for an effective description of technical contents.

The term "and/or" includes any and all combinations of one or more of which associated elements may define.

It will be understood that, although the terms "first", "second", etc. may be used herein to describe various elements, these elements should not be limited by these terms. These terms are only used to distinguish one element from another. For example, a first element may be referred to as a second element, and a second element may also be referred to as a first element in a similar manner without departing the scope of rights of the present invention. The terms of a singular form may include plural forms unless the context clearly indicates otherwise.

In addition, terms such as "below," "lower," "above," "upper," and the like are used to describe the relationship of components shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the present invention pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, exemplary embodiments of the present invention will be described in detail with reference to the accompanying drawings.

FIG. 1 is a perspective view of a display device according to an embodiment of the present invention. FIG. 2 is a view illustrating a state that a display module of the embodiment of FIG. 1 is drawn out of a housing thereof.

Referring to FIG. 1 and FIG. 2, a display device DD according to an embodiment of the present invention may include a housing HS, a display module DM received in the housing HS, a handle HND connected to the display module DM, and a support SUP adjacent to both ends of the display module DM.

The housing HS may have a hexahedral shape, but the shape of the housing HS is not limited thereto. The housing HS may be extended longer in a second direction DR2 than in the first direction DR1. Here, the second direction DR2 crosses a first direction DR1. Hereinafter, a direction substantially perpendicularly intersecting a plane defined by the first and second directions DR1 and DR2 is defined as a third direction DR3. In the present disclosure, "when viewed on a plane" may mean when viewed in the third direction DR3.

An opening OP may be defined on one side of both sides of the housing HS which are opposite to each other in the first direction DR1. The opening OP may be more adjacent to an upper portion of the housing HS than to a lower portion of the housing HS.

The display module DM may be wound on a roller disposed inside the housing HS and be drawn in and out through the opening OP. However, the embodiment of the present invention is not limited thereto. The display module DM may be drawn out to the outside by being slid from the inside of the housing to the outside thereof without using a roller. The configuration in which the display module DM is wound on a roller will be described in detail below. The display module DM may be drawn in and out through the opening OP.

The handle HND may be disposed on the outside of the housing HS and be adjacent to the opening OP. The handle HND may be adjacent to the upper portion of the housing HS. The handle HND may move in the first direction DR1. When the handle HND moves in the first direction DR1 to be away from the housing HS, the display module DM may be drawn out of the housing HS through the opening OP. The handle HND may be operated by a user.

The support SUP may be disposed on both sides of the display module DM which are opposite to each other in the second direction DR2 and support the display module DM. The above configuration will be described in detail below. The support SUP may include a first support SUP1 adjacent to one side of the display module DM, and a second support SUP2 adjacent to the other side of the display module DM. The one side and the other side of the display module DM may be the both sides of the display module DM which are opposite to each other in the second direction DR2.

FIG. 3 and FIG. 4 are perspective views of a display device according to another embodiment of the present invention.

Except for the configuration of a housing HS', a display device DD_1 illustrated in FIG. 3 and FIG. 4 may have the same configuration as the display device DD illustrated in FIG. 1 and FIG. 2. Therefore, the configuration of the housing HS' will be mainly described below.

Referring to FIG. 3 and FIG. 4, on an upper surface of the housing HS', a first opening OP1 which exposes a predetermined portion of the display module DM may be defined in the housing HS'. The first opening OP1 may be adjacent to the handle HND. The first opening OP1 may be defined continuously from the opening OP through which the display module DM is drawn in and out.

Through the portion of the display module DM exposed through the first opening OP1, an image may be displayed. In the display device DD illustrated in FIG. 1, the display module DM is disposed in the housing HS and thus is not exposed to the outside. However, on the contrary, in the display device DD_1 illustrated in FIG. 3, a portion of the display module DM may be exposed to the outside. When the handle HND moves in the first direction DR1 to be away from the housing HS', the exposed portion of the display module DM may be extended.

Figure 5:
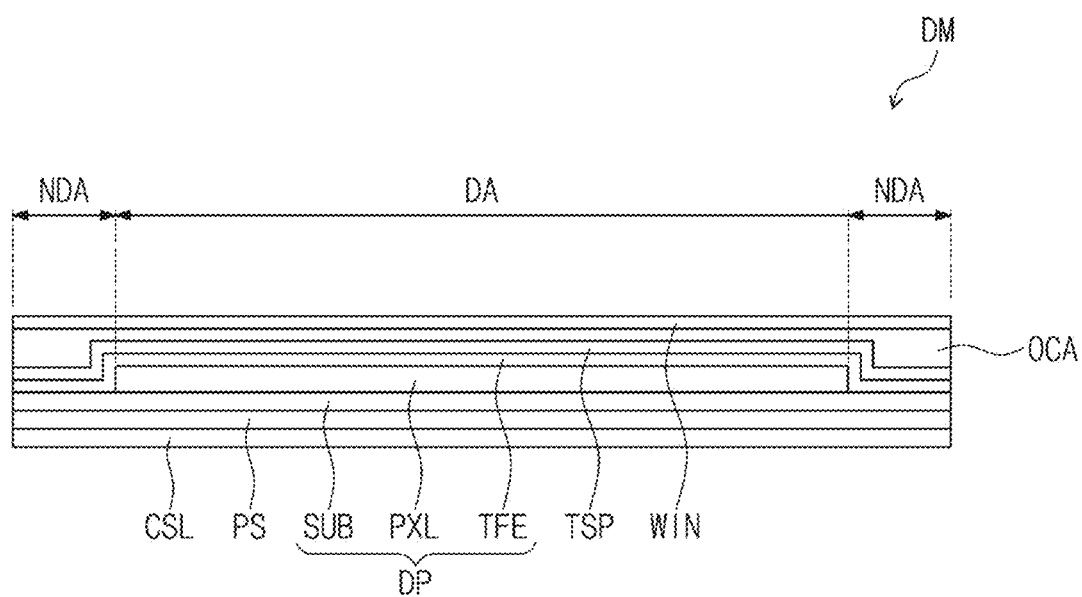
FIG. 5 is a view schematically showing a cross-section of the display module shown in FIG. 2.

FIG. 5 is a view schematically showing a cross-section of the display module shown in FIG. 2.

Referring to FIG. 5, the display module DM may include a display panel DP, a touch sensing unit TSP disposed on the display panel DP, a window WIN disposed on the touch sensing unit TSP, an adhesive OCA disposed between the touch sensing unit TSP and the window WIN, a protection substrate PS disposed below the display panel DP, and a cushion layer CSL disposed below the protection substrate PS.

The display panel DP according to an embodiment of the present invention may be a light emission-type display panel, but is not particularly limited thereto. For example, the display panel DP may be an organic light emission display panel or a quantum dot light emission display panel in another embodiment. A light emission layer of the organic light emission display panel may include an organic light emission material. A light emission layer of the quantum dot light emission display panel may include a quantum dot, a quantum load, and the like. Hereinafter, the display panel DP will be described as an organic light emission display panel.

The display panel DP may include a substrate SUB, a pixel layer PXL disposed on the substrate SUB, and a thin film encapsulation layer TFE disposed on the substrate SUB to cover the pixel layer PXL. The substrate SUB is a transparent substrate and may include a flexible plastic substrate. For example, the substrate SUB may include polyimide ("PI").

The substrate SUB may include a display region DA and a non-display region NDA around the display region DA. The pixel layer PXL may be disposed on the display region DA. The pixel layer PXL includes a plurality of pixels, and each of the pixels may include a light emission element.

The thin film encapsulation layer may include at least two inorganic layers and an organic layer disposed between the inorganic layers. The inorganic layers include an inorganic material, and may protect the pixel layer PXL from moisture/oxygen. The organic layer includes an organic material, and may protect the pixel layer PXL from foreign materials such as dust particles.

The touch sensing unit TSP senses an external input (e.g., a user's touch) and changes the same into a predetermined input signal, and may provide the input signal to the display panel DP. The touch sensing unit TSP may include a plurality of touch sensors (not shown) for sensing an external input. The touch sensors may sense the external input in a capacitive manner. The display panel DP is provided with an input signal from the touch sensing unit TSP, and may generate an image corresponding to the input signal.

The window WIN may protect the display panel DP and touch sensing unit TSP from external scratches and impacts. The window WIN may be bonded to the touch sensing unit TSP by the adhesive OCA. The adhesive OCA may include an optical clear adhesive. The image generated in the display panel DP may transmit the window WIN and be provided to a user.

The protection substrate PS may protect a lower portion of the display panel DP. The protection substrate PS may include a flexible plastic substrate. For example, the protection substrate PS may include polyethylene terephthalate ("PET").

The cushion layer CSL may protect the display panel DP by adsorbing external impacts applied to a lower portion of the display module DM. The cushion layer CSL may include a foam sheet having a predetermined elastic force.

Figure 6:
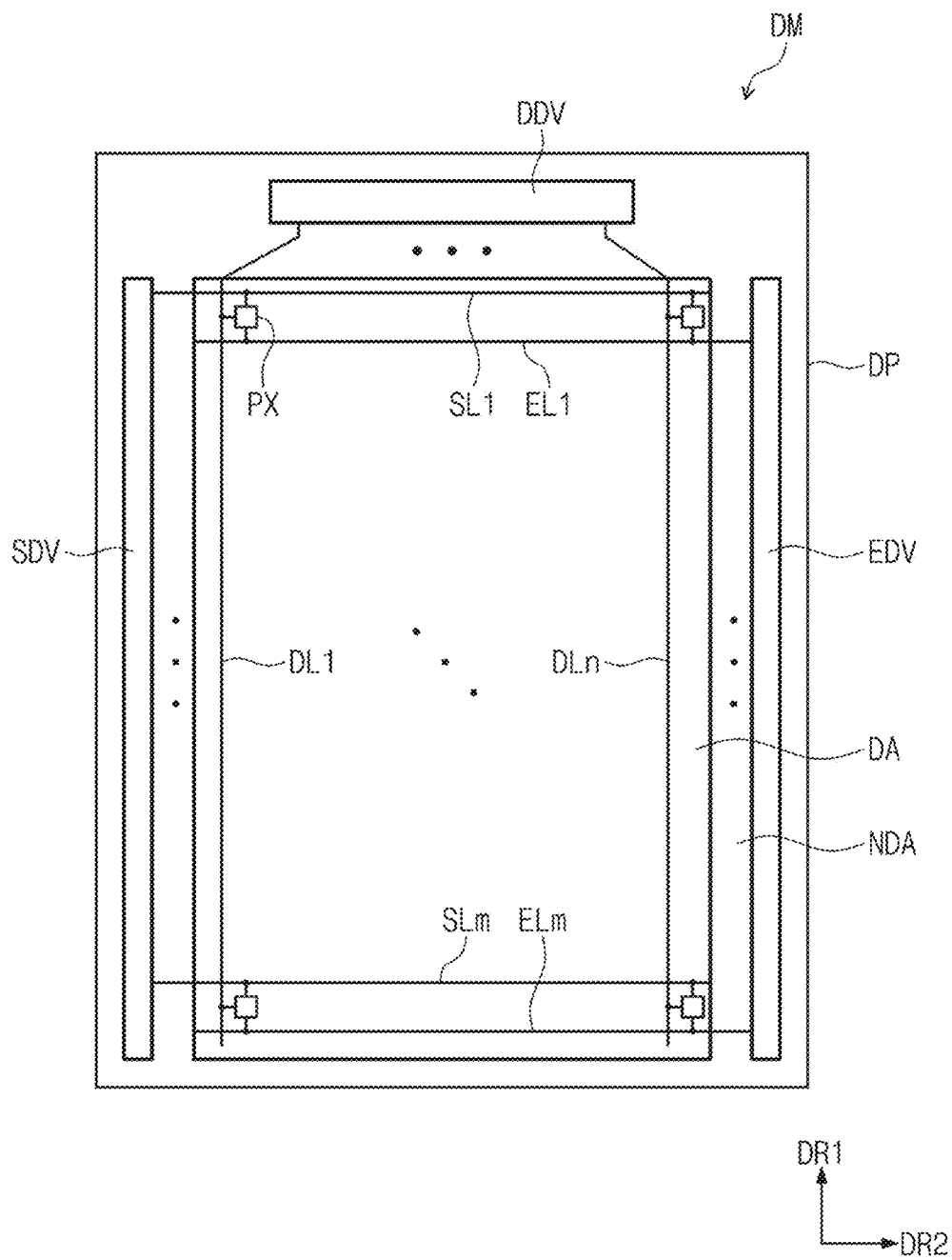
FIG. 6 is a plan view of the display module illustrated in FIG. 5.

FIG. 6 is a plan view of the display module illustrated in FIG. 5.

Referring to FIG. 6, the display module DM according to an embodiment of the present invention may include the display panel DP, a scan driver SDV, a data driver DDV, and a light emission driver EDV. FIG. 6 exemplarily illustrate the planar configuration of the display panel DP, and the planar configuration of the touch sensing unit TSP is omitted.

The display panel DP may be a flexible display panel. For example, the display panel DP may include a plurality of electronic elements disposed on a flexible substrate. The display panel DP may have a rectangular shape which has long sides in the first direction DR1 has short sides in the second direction DR2. The display panel DP may include the display region DA and the non-display region NDA surrounding the display region DA.

The display panel DP may include a plurality of pixels PX, a plurality of scan lines SL1 to SLm, a plurality of data lines DL1 to DLn, and a plurality of light emission lines EL1 to ELm. m and n are natural numbers. The pixels PX may be arranged in a matrix form, but are not limited thereto, and may be arranged in various forms. The pixels PX are disposed in the display region DA, and may be connected to the scan lines SL1 to SLm, the data lines DL1 to DLn, and the emission lines EL1 to ELm.

The scan driver SDV, the data driver DDV, and the light emission driver EDV may be disposed in the non-display region NDA. The scan driver SDV and the light emission driver EDV may each be disposed adjacent to the long sides of the display panel DP. The data driver DDV may be manufactured in the form of an integrated circuit chip and be disposed adjacent to one short side among the short sides of the display panel DP.

The scan lines SL1 to SLm may be extended in the second direction DR2 and be connected to the scan driver SDV. The data lines DL1 to DLn may be extended in the first direction DR1 and be connected to the data driver DDV. The light emission lines EL1 to ELm may be extended in the second direction DR2 and be connected to the light emission driver EDV.

The scan driver SDV generates a plurality of scan signals, and the scan signals may be applied to the pixels PX through the scan lines SL1 to SLm. The scan signals may be sequentially applied to the pixels PX. The data driver DDV generates a plurality of data voltages, and the data voltages may be applied to the pixels PX through the data lines DL1 to DLn. The light emission driver EDV generates a plurality of light emission signals, and the light emission signals may be applied to the pixels PX through the light emission lines EL1 to ELm.

Although not illustrated, the display module DM may include a timing controller (not shown) for controlling operations of the scan driver SDV, the data driver DDV, and the light emission driver EDV.

The timing controller may generate a scan control signal, a data control signal, and a light emission control signal in response to control signals received from the outside. The timing controller receives image signals from the outside, and may convert the data format of the image signals to meet interface specifications with the data driver DDV and provide the image signals with the converted data format to the data driver DDV.

The scan driver SDV generates scan signals in response to the scan control signal, and the light emission driver EDV may generate light emission signals in response to the light emission control signal. The data driver DDV is provided with the image signals with the converted data format, and may generate data voltages corresponding to the image signals in response to the data control signal.

The pixels PX may be provided with the data voltages in response to the scan signals. The pixels PX may display an image by emitting light of luminance corresponding to the data voltages in response to the light emission signals. The light emission duration of the pixels PX may be controlled by the light emission signals.

Figure 7:
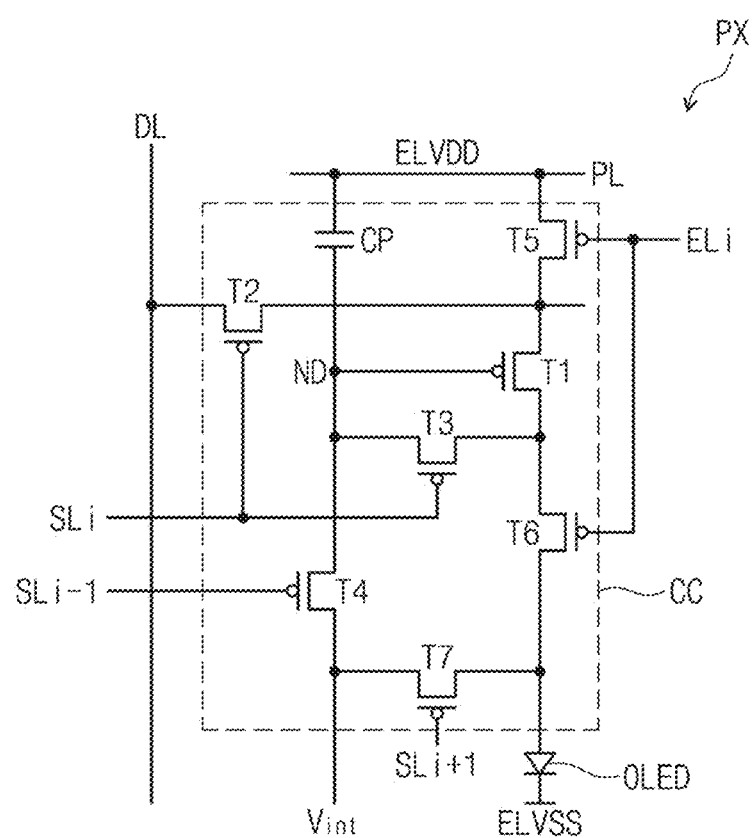
FIG. 7 is a view exemplarily illustrating an equivalent circuit of one pixel illustrated in FIG. 6.

FIG. 7 is a view exemplarily illustrating an equivalent circuit of one pixel illustrated in FIG. 6.

Referring to FIG. 7, a pixel PX may include a light emission element OLED and a pixel circuit CC. The circuit unit CC may include a plurality of transistors T1 to T7 and a capacitor CP. The pixel circuit CC may control an amount of current flowing in the light emission element OLED in correspondence to a data voltage.

The light emission element OLED may emit light to a predetermined luminance in correspondence to an amount of current provided from the pixel circuit CC. To this end, the level of a first voltage ELVDD may be set to be higher than the level of a second voltage ELVSS.

The transistors T1 to T7 may each include an input electrode (or a source electrode), an output electrode (or a drain electrode), and a control electrode (or a gate electrode). In the present disclosure, any one of the input electrode and the output electrode may be referred to as a first electrode, and the other one thereof may be referred to as a second electrode for convenience.

A first electrode of a first transistor T1 may be applied with the first voltage ELVDD via a fifth transistor T5, and a second electrode thereof may be connected to an anode of the light emission element OLED via a sixth transistor T6. The first transistor T1 may be defined a driving transistor. The first transistor T1 may control the amount of current flowing in the light emission element OLED in accordance with a voltage applied to a control electrode of the first transistor T1.

A second transistor T2 may be connected between a data line DL and the first electrode of the first transistor T1, and a control electrode of the second transistor T2 may be connected to an i-th scan line SLi. The second transistor T2 may be turned on by receiving an i-th scan signal Si through the i-th scan line SLi and electrically connect the data line DL and the first electrode of the first transistor T1.

A third transistor T3 may be connected between the second electrode of the first transistor T1 and the control electrode thereof. A control electrode of the third transistor T3 may be connected to the i-th scan line SLi. The third transistor T3 may be turned on by receiving the i-th scan signal Si through the i-th scan line SLi and electrically connect the second electrode of the first transistor T1 and the control electrode thereof. When the third transistor T3 is turned on, the first transistor T1 may be connected in a diode form.

A fourth transistor T4 may be connected between a node ND and an initialization power generator (not shown). A control electrode of the fourth transistor T4 may be connected to an i-1-th scan line SLi-1. The fourth transistor T4 may be turned on by receiving an i-1-th scan signal Si-1 through the i-1-th scan line SLi-1 and provide an initialization voltage Vint to the node ND.

The fifth transistor T5 may be connected between a power line PL and the first electrode of the first transistor T1. A control electrode of the fifth transistor T5 may be connected to an i-th light emission line ELi.

The sixth transistor T6 may be connected between the second electrode of the first transistor T1 and the anode of the light emission element OLED. A control electrode of the sixth transistor T6 may be connected to the i-th light emission line ELi.

A seventh transistor T7 may be connected between the initialization power generator (not shown) and the anode of the light emission element OLED. A control electrode of the seventh transistor T7 may be connected to an i+1-th scan line SLi+1. The seventh transistor T7 may be turned on by receiving an i+1-th scan signal Si+1 through the i+1-th scan line SLi+1 and provide the initialization voltage Vint to the anode of the light emission element OLED.

The capacitor CP may be disposed between the power line PL and the node ND. The capacitor CP may store a data voltage. When the fifth transistor T5 and the sixth transistor T6 are turned on, an amount of current flowing in the first transistor T1 may be determined according to a voltage stored in the capacitor CP.

In FIG. 7, the transistors T1 to T7 are illustrated as being PMOS transistors, but the embodiment of the present invention is not limited thereto. In another embodiment of the present invention, the transistors T1 to T7 may be configured to be NMOS transistors.

Figure 8:
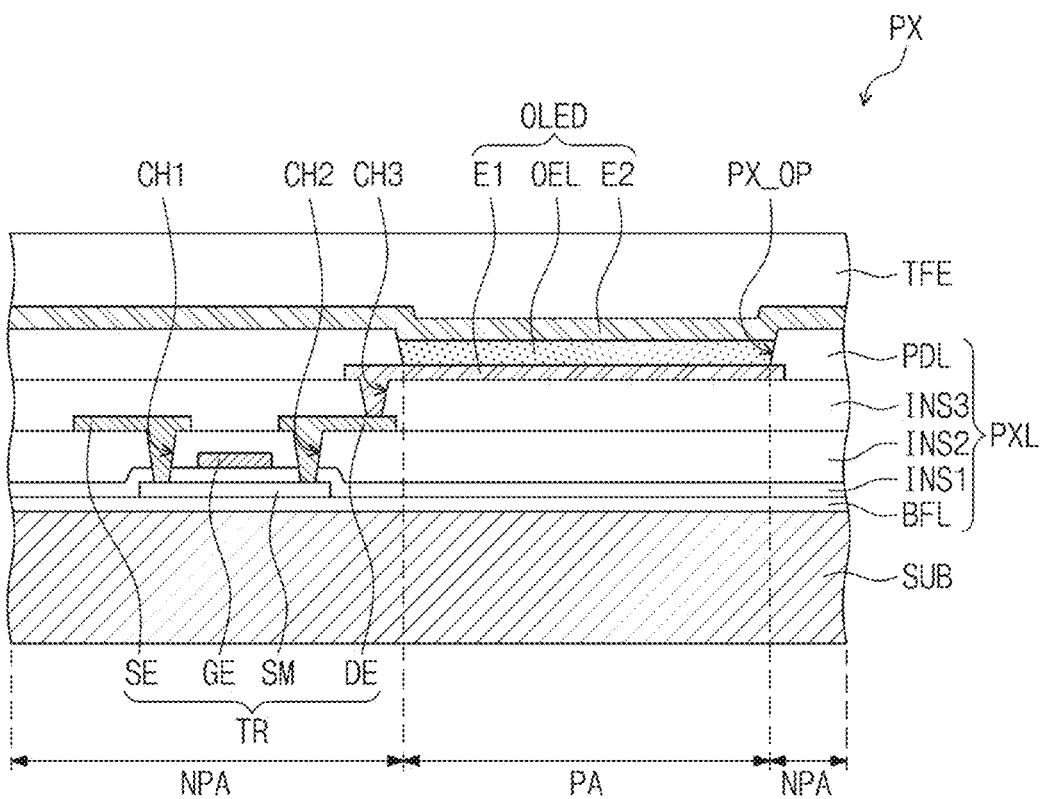
FIG. 8 is a view illustrating a cross-section of a portion corresponding to a light emission element illustrated in FIG. 7.

FIG. 8 is a view illustrating a cross-section of a portion corresponding to a light emission element illustrated in FIG. 7.

Referring to FIG. 8, the pixel PX may include the light emission element OLED, and a transistor TR connected to the light emission element OLED. The light emission element OLED may include a first electrode E1, a second electrode E2, and an organic light emission layer OEL disposed between the first electrode E1 and the second electrode E2. The transistor TR may be the sixth transistor T6 illustrated in FIG. 7. The light emission element OLED may be defined as an organic light emission element.

The first electrode E1 may be an anode, and the second electrode E2 may be a cathode. The first electrode E1 may be defined as a pixel electrode, and the second electrode E2 may be defined as a common electrode.

The pixel PX may be divided into a pixel region PA and a non-pixel region NPA around the pixel region PA. The light emission element OLED may be disposed in the pixel region PA, and the transistor TR may be disposed in the non-pixel region NPA.

The transistor TR and the light emission element OLED may be disposed on the substrate SUB. On the substrate SUB, a buffer layer BFL is disposed, and the buffer layer BFL may include an inorganic material.

On the buffer layer BFL, a semiconductor layer SM of the transistor TR may be disposed. The semiconductor layer SM may include a semiconductor of an inorganic material such as amorphous silicon or crystalline silicon, or an organic semiconductor. In addition, the semiconductor layer SM may include an oxide semiconductor. Although not illustrated in FIG. 8, the semiconductor layer SM may include a source region, a drain region, and a channel region between the source region and the drain region.

A first insulation layer INS1 may be disposed on the buffer layer BFL to cover the semiconductor layer SM. The first insulation layer INS1 may include an inorganic material. On the first insulation layer INS1, a gate electrode GE of the transistor TR overlapping the semiconductor layer SM in a plan view may be disposed. The gate electrode GE may be disposed to overlap the channel region of the semiconductor layer SM in a plan view.

A second insulation layer INS2 may be disposed on the first insulation layer INS1 to cover the gate electrode GE. The second insulation layer INS2 may include an organic material and/or an inorganic material.

On the second insulation layer INS2, a source electrode SE and a drain electrode DE of the transistor TR may be disposed spaced apart from each other. The source electrode SE may be connected to the source region of the semiconductor layer SM through a first contact hole CH1 defined in the first insulation layer INS1 and the second insulation layer INS2. The drain electrode DE may be connected to the drain region of the semiconductor layer SM through a second contact hole CH2 defined in the first insulation layer INS1 and the second insulation layer INS2.

A third insulation layer INS3 may be disposed on the second insulation layer INS2 to cover the source electrode SE and the drain electrode DE of the transistor TR. The third insulation layer INS3 may be defined as a planarization film which provides a flat upper surface, and may include an organic material.

On the third insulation layer INS3, the first electrode E1 may be disposed. The first electrode E1 may be connected to the drain electrode DE of the transistor TR through a third contact hole CH3 defined in the third insulation layer INS3.

On the first electrode E1 and the third insulation layer INS3, a pixel definition layer PDL which exposes a predetermined portion of the first electrode E1 may be disposed.

In the pixel definition layer PDL, an opening PX_OP for exposing the predetermined portion of the first electrode E1 may be defined.

In the opening PX_OP, the organic light emission layer OEL may be disposed on the first electrode E1. The organic light emission layer OEL may generate light of any one of red, green, and blue colors. However, the embodiment of the present invention is not limited thereto. The organic light emission layer OEL may generate white light due to the combination of organic materials generating red, green, and blue colors.

On the pixel definition layer PDL and the organic light emission layer OEL, the second electrode E2 may be disposed. The thin film encapsulation layer TFE may be disposed on the light emission element OLED to cover the pixel PX. A layer between the substrate SUB and the thin film encapsulation layer TFE may be defined as the pixel layer PXL.

The first voltage ELVDD may be applied to the first electrode E1, and the second voltage ELVSS may be applied to the second electrode E2. A hole and an electron injected to the organic light emission layer OEL are combined to form an exciton, and when the exciton transits to a ground state, the light emission element OLED may emit light. As the light emission element OLED emits light of red, green, and blue colors according to the flow of a current, an image may be displayed.

Figure 9:
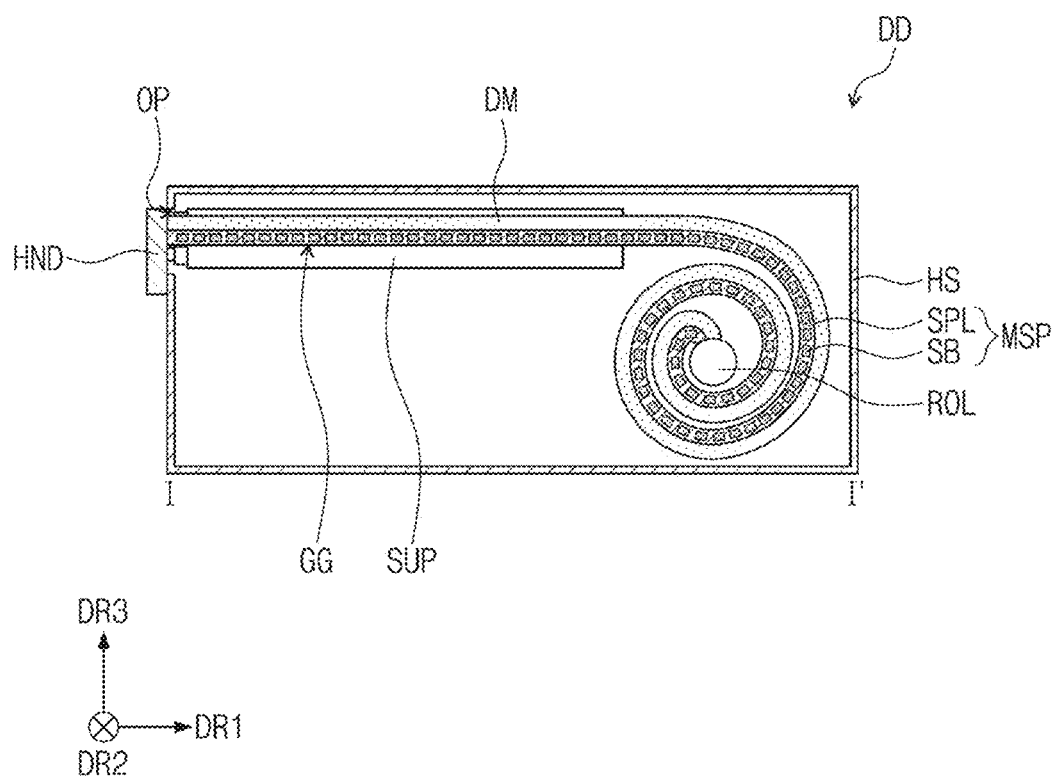
FIG. 9 is a cross-sectional view of line I-I' illustrated in FIG. 1.
Figure 11:
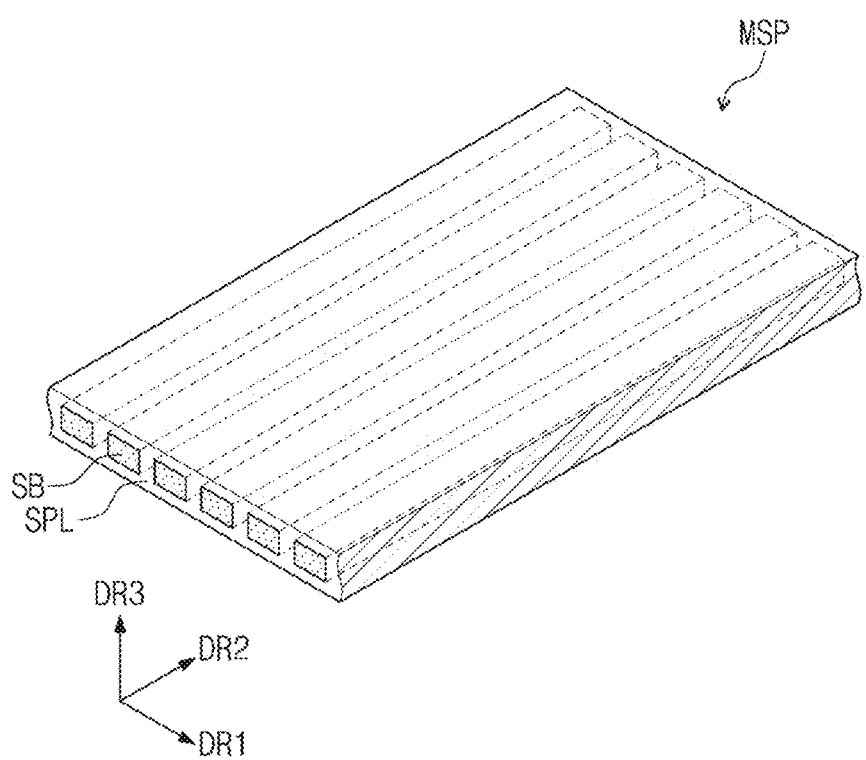
FIG. 11 is a view illustrating a portion of a module support illustrated in FIG. 10.

FIG. 9 is a cross-sectional view of line I-I' illustrated in FIG. 1. FIG. 10 is an internal side view of the housing illustrated in FIG. 1 of which inside is viewed in the second direction. FIG. 11 is a view illustrating a portion of a module support illustrated in FIG. 10.

For convenience of description, the housing HS is omitted in FIG. 10, and a module support MSP in a flat state is illustrated in FIG. 11.

Referring to FIG. 9 and FIG. 10, the display device DD may include the housing HS, the display module DM, a roller ROL, the module support MSP, the support SUP, and the handle HND. The display module DM, the roller ROL, the module support MSP, and the support SUP may be received in the housing HS.

The roller ROL is disposed in the housing HS, and may be adjacent to one side of the housing HS, which is opposite to the other side of the housing HS on which the opening OP is defined. The one side and the other side of the housing HS may be the both sides of the housing HS which are opposite to each other in the first direction DR1. When viewed in the second direction DR2, the roller ROL may have a circular shape. For example, the roller ROL may have a cylindrical shape extending in the second direction DR2. The roller ROL may rotate in a clockwise direction and in a counter-clockwise direction. Although not illustrated, the display device DD may further include a driving unit for rotating the roller ROL.

The display module DM may extend in the first direction DR1 and be wound on the roller ROL. One end of the display module DM may be connected to the roller ROL. A portion of the display module DM may be wound on the roller ROL, and another portion of the display module DM may not be wound on the roller ROL but be disposed to overlap the support SUP. The other end of the display module DM, which is opposite to the one end of the display module DM, may be connected to the handle HND. The other end of the display module DM may be adjacent to the opening OP.

The front surface of display module DM may be defined as a surface which displays an image. The module support MSP may be disposed below the display module DM and support the display module DM. The module support MSP may be bonded to the back surface of the display module DM, which is the opposite surface of the front surface of the display module DM. For example, the module support MSP may be bonded to the back surface of the display module DM through a pressure sensitive adhesive.

The module support MSP may extend in the first direction DR1 and be wound on the roller ROL. One end of the module support MSP may be connected to the roller ROL, and the other end of the module support MSP may be connected to the handle HND. The other end of the module support MSP may be adjacent to the opening OP. A portion of the module support MSP may be wound on the roller ROL, and another portion of the module support MSP may not be wound on the roller ROL but be disposed to overlap the support SUP in a plan view.

The module support MSP may include a support layer SPL disposed below the display module DM, and a plurality of support bars SB disposed below the support layer SPL. When viewed in the second direction DR2, the support bars SB may have a quadrangular shape, but the shape of the support bars SB is not limited thereto.

Referring to FIG. 9, FIG. 10, and FIG. 11, the support bars SB may extend in the second direction DR2 and be arranged in the first direction DR1. Illustratively, in FIG. 11, the support bars SB disposed in the support layer SPL are illustrated as dotted lines. The support bars SB may be spaced apart from each other at equal gaps in the direction DR1, but the gap between the support bars SB is not limited thereto.

Both ends of each of the support bars SB, which are opposite to each other in the second direction DR2, may not be disposed in the support layer SPL but be exposed to the outside of the support layer SPL. Depending on a manufacturing method of the module support MSP, both ends of each of the support bars SB may be exposed to the outside, and the manufacturing method will be described in detail below.

The support bars SB may be of a rigid type. For example, the support bars SB may include a metal. The support bars SB may include aluminum, stainless steel, or invar. In addition, the support bars SB may include a metal which may attach to a magnet.

The support layer SPL may include an elastomer having a predetermined elastic force. For example, the support layer SPL may include at least one among thermoplastic polyurethane, silicone, thermoplastic rubbers, elastolefin, thermoplastic olefin, polyamide, polyether block amide, synthetic polyisoprene, polybutadiene, chloroprene rubber, butyl rubber, styrene-butadiene, epichlorohydrin rubber, polyacrylic rubber, silicone rubber, fluorosilicone rubber, fluoroelastomers, and ethylene-vinyl acetate.

The support bars SB may have a modulus greater than a modulus of the support layer SPL. The support layer SPL may have a modulus of 20 kilopascals (KPa) to 20 megapascals (MPa). The support bars SB may have a modulus of 1 gigapascal (GPa) to 200 gigapascals (GPa).

The display module DM and the module support MSP may be drawn in and out through the opening OP. One end of the support SUP may be connected to the handle HND. The support SUP may be extended in the first direction DR1 like an antenna. The above configuration will be described in detail below.

A guide groove GG may be defined in the support SUP. The module support MSP may be disposed in the guide groove GG and move in the first direction DR1 along the guide groove GG. The module support MSP may be disposed in the guide groove GG and be supported by the support SUP, and the module support MSP may support the display module DM. That is, substantially, the support SUP may serve to support the display module DM.

The support layer SPL may not be used, and the support bars SB may be bonded to a lower surface of the display module DM to support the display module DM. In the above structure, when the display module DM is repeatedly rolled and unrolled, the display module DM may be deformed in a space between the support bars SB. For example, a portion of the display module DM overlapping the space between the support bars SB in a plan view may be stretched and lowered, and such deformation may be visually recognized to the outside as a wrinkle shape. That is, the surface quality of the display module DM may be degraded.

The support bars SB having greater rigidity may support the display module DM, and the support layer SPL having a predetermined elasticity may provide a flat upper surface to the display module DM. Since the display module DM is bonded to the flat upper surface of the support layer SPL, a portion of the display module DM overlapping a space between the support bars SB in a plan view may not be deformed in a flat state. That is, the surface quality of the display module DM may be effectively improved.

Figure 12:
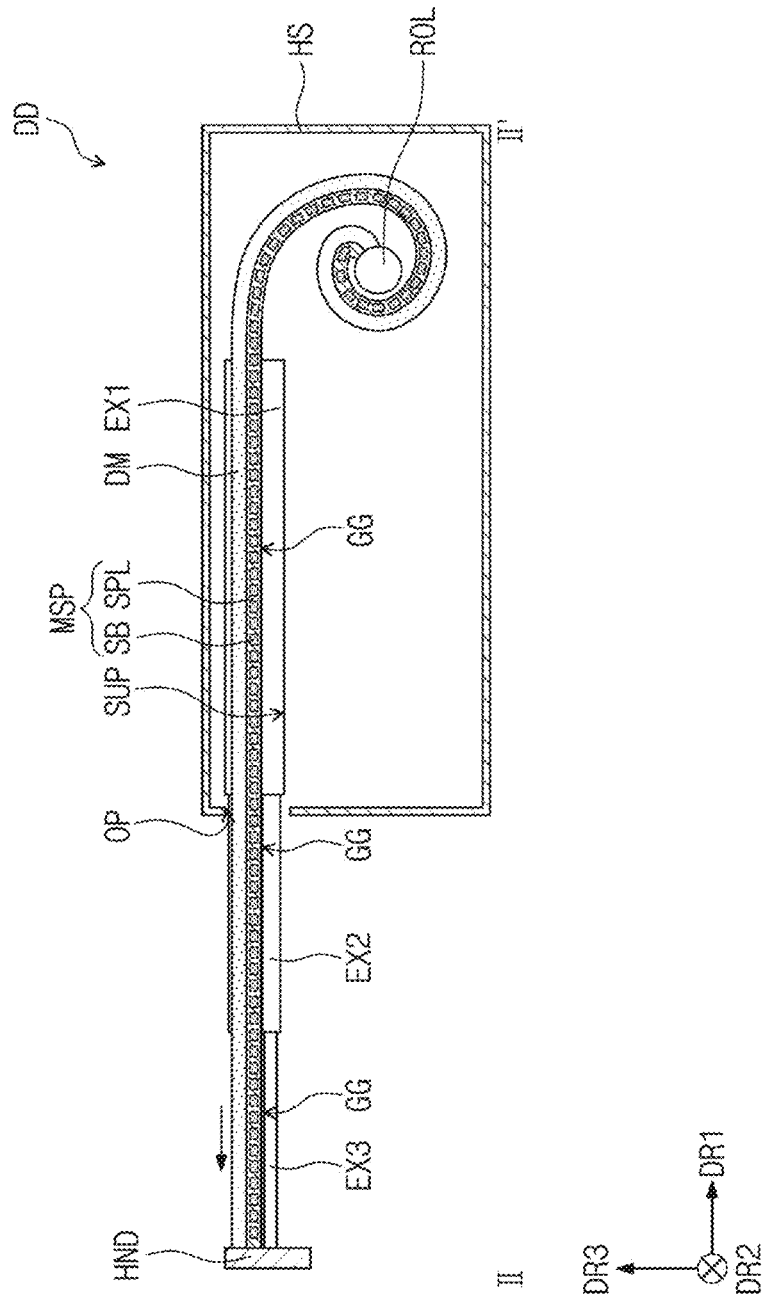
FIG. 12 is a cross-sectional view of line II-IF illustrated in FIG. 2.
Figure 13:
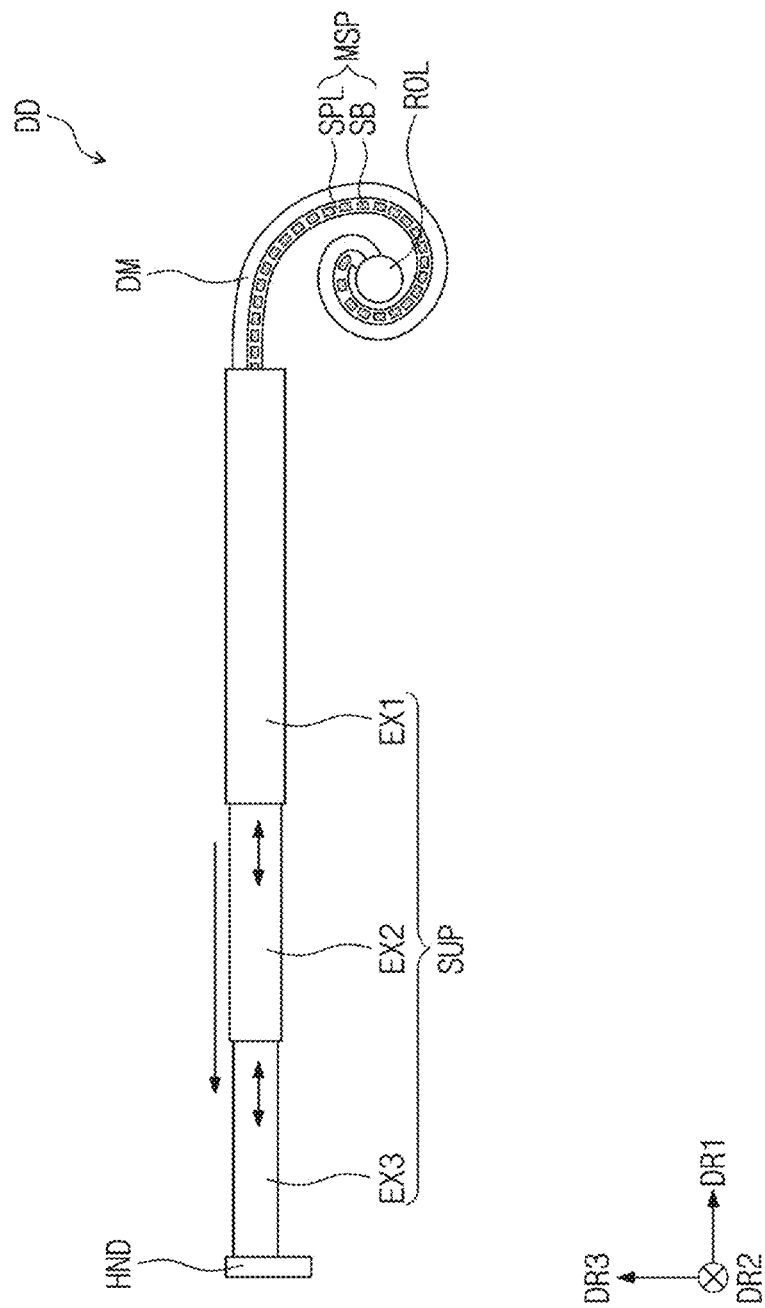
FIG. 13 is an internal side view of the housing illustrated in FIG. 2 of which inside is viewed in the second direction.

FIG. 12 is a cross-sectional view of line II-IF illustrated in FIG. 2. FIG. 13 is an internal side view of the housing illustrated in FIG. 2 of which inside is viewed in the second direction.

For convenience of description, the housing HS is omitted in FIG. 13.

Referring to FIG. 12 and FIG. 13, the handle HND may move in the first direction DR1 to be away from the housing HS. According to the movement of the handle HND, the display module DM and the module support MSP connected to the handle HND may move in the first direction DR1.

The display module DM and the module support MSP are unwound from the roller ROL, and the unwound display module DM and the module support MSP may be drawn to the outside of the housing HS through the opening OP. An operation in which the display module DM is exposed to the outside of the housing HS may be defined as an open mode. In the open mode, an exposed portion of the display module DM may be extended.

When the display module DM and the module support MSP are drawn out of the housing HS according to the movement of the handle HND, the support SUP connected to the handle HND may be extended to the outside of the housing HS through the opening OP. The support SUP may be extended to the outside of the housing HS and support the display module DM from the outside. For example, the module support MSP moved to the outside of the housing HS is supported by the support SUP, and the module support MSP supported by the support SUP may support the display module DM.

To be extended to the outside of the housing HS, the support SUP may include a first extension EX1, a second extension EX2, and a third extension EX3. The second extension EX2 may be disposed between the first extension EX1 and the third extension EX3.

In order to have a structure which may be extended like an antenna, the second extension EX2 may be drawn into and out of the first extension EX1, and the third extension EX3 may be drawn into and out of the second extension EX2. The first extension EX1 may be disposed inside the housing HS, and the second and third extensions EX2 and EX3 may move to the outside of the housing HS. The third extension EX3 may be connected to the handle HND.

In each of the first, second, and third extensions EX1, EX2, and EX3, the guide groove GG may be defined. The guide grooves GG defined in the first, second, and third extensions EX1, EX2, and EX3 may be named as a continuous space overlapping each other in the first direction DR1. The module support MSP may be disposed in the guide grooves GG.

When the handle HND moves in the first direction DR1 to be close to the housing HS, as illustrated in FIG. 9 and FIG. 10, the handle HND may be disposed adjacent to the opening OP on the outside of the housing HS. According to the movement of the handle HND, the support SUP may be reduced in the first direction DR1 and be disposed inside the housing HS, and the display module DM and the module support MSP may be drawn into the housing HS. Such an operation may be defined as a closed mode.

FIG. 14 is a cross-sectional view of line illustrated in FIG. 2. FIG. 15 is a perspective view of a support illustrated in FIG. 13.

FIG. 14 is, substantially, a view for describing the module support MSP disposed in the first and second supports SUP1 and SUP2. Therefore, for convenience of description, FIG. 14 illustrates the module support MSP disposed in the first and second supports SUP1 and SUP2, the display module DM disposed on the module support MSP, and portions of the housing HS adjacent to the first and second supports SUP1 and SUP2, and other components are omitted.

Referring to FIG. 14 and FIG. 15, the support SUP may include the first support SUP1 and the second support SUP2 extending in the first direction DR1 and spaced apart from each other in the second direction DR2.

The first support SUP1 and the second support SUP2 may support both sides of the module support MSP which are opposite to each other in the second direction DR2. For example, both sides of the module support MSP may be inserted into guide grooves GG, respectively, where the guide grooves GG may be defined on an inner side surface of the first support SUP1 and on an inner side surface of the second support SUP2 and face each other. The module support MSP may move in the first direction DR1 along the guide grooves GG defined in the first and second supports SUP1 and SUP2.

Each of the first support SUP1 and the second support SUP2 may each include the first extension EX1, the second extension EX2, and the third extension EX3 in which the guide grooves GG are defined. The configurations of the first extension EX1, the second extension EX2, and the third extension EX3 have been described above in detail, and thus, descriptions thereof will be omitted.

One end of the first support SUP1 and one end of the second support SUP2 which are defined as one end of the support SUP may be connected to the handle HND. Specifically, the third extensions EX3 of the first and second supports SUP1 and SUP2 may be connected to the handle HND.

The first extensions EX1 may be connected to the housing HS. For example, the first extensions EX1 may be connected to inner side surfaces of the housing HS facing each other in the second direction DR2 and fixed thereto. In the open mode, the first extensions EX1 may be disposed inside the housing HS, and the second and third extensions EX2 and EX3 may move to the outside of the housing HS. Therefore, in the open mode, the first and second supports SUP1 and SUP2 may be extended to the outside of the housing HS.

The display module DM may be disposed on the module support MSP and be disposed between the first support SUP1 and the second support SUP2.

In an embodiment of the present invention, the support bars SB having greater rigidity supports the display module DM, and the support layer SPL having a predetermined elasticity provides a flat upper surface to the display module DM, so that the surface quality of the display module DM may be effectively improved.

FIG. 16 to FIG. 19 are views illustrating components of module supports according to various embodiments of the present invention.

Except for configurations of support bars SB_1, SB_2, SB_3, and SB_4, configurations of module supports MSP_1, MSP_2, MSP_3, and MSP_4 may be the same as the configuration of the module support MSP illustrated in FIG. 11.

Therefore, hereinafter, for convenience of description, FIG. 16 to FIG. 19 illustrate a cross-section of a portion of each of the module supports MSP_1, MSP_2, MSP_3, and MSP_4. The cross-sections are cross-sections viewed in the second direction DR2. In addition, a support layer SPL illustrated in each of FIG. 16 to FIG. 19 is the same as the support layer SPL of the module support MSP illustrated in FIG. 11, and thus, is illustrated using the same reference numeral.

Referring to FIG. 16 to FIG. 18, the support bars SB illustrated in FIG. 11 have a quadrangular shape, but may have various shapes other than the quadrangular shape.

For example, as illustrated in FIG. 16, a module support MSP_1 may include a support layer SPL, and when viewed in the second direction DR2, a plurality of support bars SB_1 having an inverted trapezoidal shape. The support bars SB_1 may extend in the second direction DR2 and be arranged in the first direction DR1.

As illustrated in FIG. 17, a module support MSP_2 may include a support layer SPL, and when viewed in the second direction DR2, a plurality of support bars SB_2 having an inverted triangular shape. The support bars SB_2 may extend in the second direction DR2 and be arranged in the first direction DR1.

As illustrated in FIG. 18, a module support MSP_3 may include a support layer SPL, and when viewed in the second direction DR2, a plurality of support bars SB_3 having a circular shape. The support bars SB_3 may extend in the second direction DR2 and be arranged in the first direction DR1.

Figure 19:
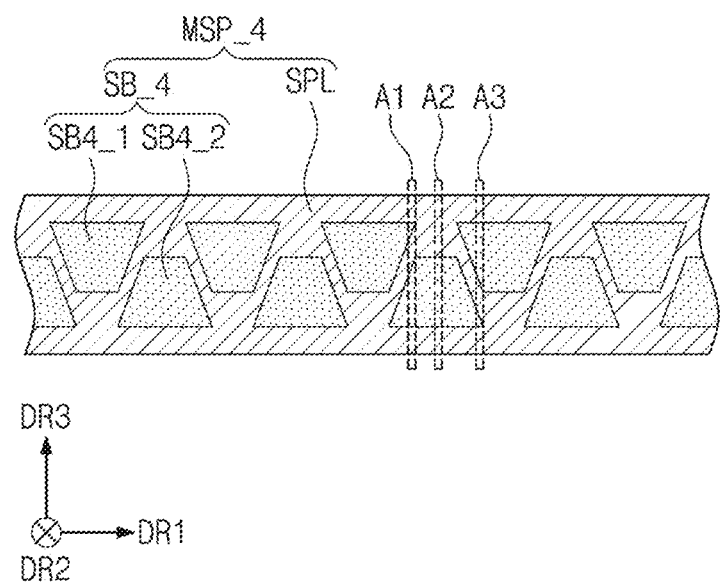

Referring to FIG. 19, a module support MSP_4 may include a support layer SPL and a plurality of support bars SB_4. The support bars SB_4 may extend in the second direction DR2 and be arranged in the first direction DR1. The support bars SB_4 may include a plurality of first support bars SB4_1 and a plurality of second support bars SB4_2.

The first support bars SB4_1 extend in the second direction DR2, and may be evenly arranged in the first direction DR1. The second support bars SB4_2 extend in the second direction DR2, and may be evenly arranged in the first direction DR1. The second support bars SB4_2 may be alternately disposed with the first support bars SB4_1 in the first direction DR1.

The second support bars SB4_2 may be disposed at a different height from the first support bars SB4_1 from a lower surface of the support layer SPL. The second support bars SB4_2 may be disposed lower than the first support bars SB4_1. Specifically, an upper surface of each of the second support bars SB4_2 may be disposed between an upper surface and a lower surface of each of the first support bars SB4_1 in its height. A lower surface of each of the second support bars SB4_2 may be disposed lower than the lower surface of each of the first support bars SB4_1. When viewed on a plane (i.e., in a plan view), the first support bars SB4_1 may partially overlap the second support bars SB4_2.

When viewed in the second direction DR2, the first support bars SB4_1 may have opposite shapes (or reverse shapes) of the second support bars SB4_2. For example, the first support bars SB4_1 may have an inverted trapezoidal shape, and the second support bars SB4_2 may have a trapezoidal shape.

When viewed on a plane, upper surfaces of the first support bars SB4_1 may not overlap upper surfaces of the second support bars SB4_2. In addition, when viewed on a plane (i.e., in a plan view), lower surfaces of the first support bars SB4_1 may not overlap lower surfaces of the second support bars SB4_2.

The proportion of a region in which the first and second support bars SB4_1 and SB4_2 are disposed on a cross-section of the module support MSP_4 cut by a plane defined by the second and third directions may be uniform. For example, when viewed in the second direction DR2, first, second, and third cross-sectional regions A1, A2, and A3 extending in the second and third directions DR2 and DR3 and spaced apart from each other in the first direction DR1 may be defined in the module support MSP_4.

The ratio of an area occupied by the first and second support bars SB4_1 and SB4_2 to an area occupied by the support layer SPL in the first region A1 on the cross-section may be the same as the ratio of an area occupied by the first and second support bars SB4_1 and SB4_2 to an area occupied by the support layer SPL in the second region A2 on the cross-section. In addition, the ratio of an area occupied by the first and second support bars SB4_1 and SB4_2 to an area occupied by the support layer SPL in the second region A2 on the cross-section may be the same as the ratio of an area occupied by the first and second support bars SB4_1 and SB4_2 to an area occupied by the support layer SPL in the third region A3 on the cross-section.

That is, the average weight of regions in which the first and second support bars SB4_1 and SB4_2 are disposed in the module support MSP_4 on the cross-section may be the same. In addition, the average density may be the same over the entire region of the module support MSP_4. When the proportion of the region in which the first and second support bars SB4_1 and SB4_2 are disposed in the module support MSP_4 on the cross-section is uniform, the flatness of the module support MSP_4 may be more easily maintained. Therefore, even more easily, a flat upper surface of the module support MSP_4 may be provided to the display module DM.

Figure 20:
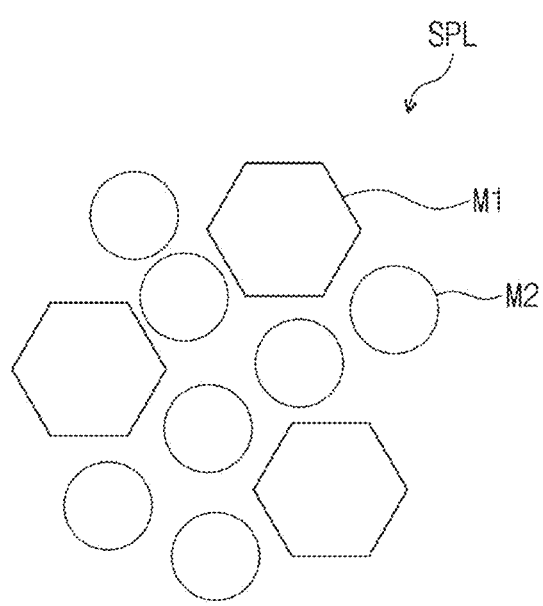
FIG. 20 to FIG. 22 are views for describing the configuration of a support layer illustrated in FIG. 11 and a manufacturing method thereof.
Figure 21:
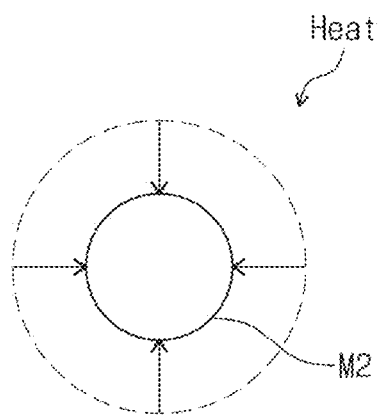
Figure 22:
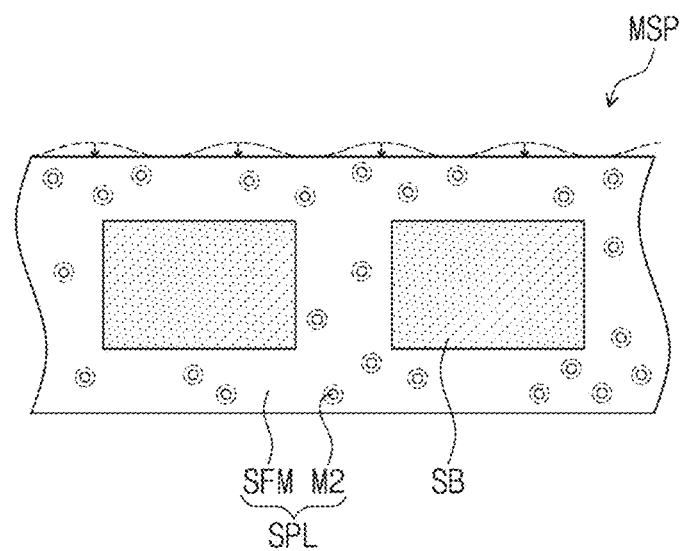

FIG. 20 to FIG. 22 are views for describing the configuration of a support layer illustrated in FIG. 11.

Referring to FIG. 20 and FIG. 21, the support layer SPL may include a first material M1 and a second material M2. The second material M2 has a negative coefficient of thermal expansion ("CTE"). The first material M1 may be the above-mentioned elastomer. The second material M2 may include at least one among $ZrW_2O_8$, $ZrV_2O_2$, $Ag_3Co(CN)_6$, and $Sc_2(WO_4)_3$.

A material having a positive coefficient of thermal expansion may expand when heated, and may shrink when cooled. On the contrary, when heat is applied to the second material M2 having a negative coefficient of thermal expansion, the second material M2 may be reduced. In addition, when the second material M2 having the negative coefficient of thermal expansion is cooled, the second material M2 may expand. The first material M1 and the second material M2 may be mixed together, and the second material M2 may be mixed with the first material M1 at a ratio of 20 percentages (%) to 40% based on the first material M1.

The support layer SPL may be manufactured as follows. Particles of the first material M1 and particles of the second material M2 are mixed together, and the first material M1 may be melted. The first material M1 may be in a liquid phase, and the second material M2 may maintain a solid particle state. The second material M2, which are particles of the solid state may be distributed and disposed in the first material M1 of the liquid phase.

The first material M1 may be cured to form the support layer SPL. As described above, the support bars SB may be disposed in the support layer SPL. The cured first material M1 will be defined as a support film in FIG. 22 below.

The support bars SB and the first material M1 each may have a positive coefficient of thermal expansion (CTE). The coefficient of thermal expansion of the support bars SB and the coefficient of thermal expansion of the first material M1 may be different from each other.

Referring to FIG. 22, the support layer SPL may include a support film SFM formed by curing the first material M1 and the second material M2 contained in the support film SFM and having a negative coefficient of thermal expansion. The support film SFM includes the above-mentioned elastomer material, and thus, may have a predetermined elasticity. Since rates of thermal expansion of the support bars SB and the support film SFM are different from each other, the surface of the support layer SPL may be stretched and form wrinkles due to the support bars SB and the support film SFM which expand differently if there is no second material M2 in the support film SFM. Illustratively, the wrinkles formed on the surface of the support layer SPL are illustrated as dotted lines in FIG. 22.

However, in an embodiment of the present invention, when heat is applied to the module support MSP, the second material M2 having a negative coefficient of thermal expansion may shrink. Illustratively, the second material M2 before being shrunk are illustrated as a circular shape with a dotted line, and the second material M2 after being shrunk are illustrated as a circular shape with a solid line. As the second material M2 shrinks, the support layer SPL may shrink, so that wrinkles may not be formed on the surface of the support layer SPL. In sum, the support layer SPL includes the second material M2 having a negative coefficient of thermal expansion, so that the deformation of the support layer SPL may be effectively prevented.

FIG. 23 to FIG. 27 are views for describing a method for manufacturing a module support according to an embodiment of the present invention.

Figure 24:
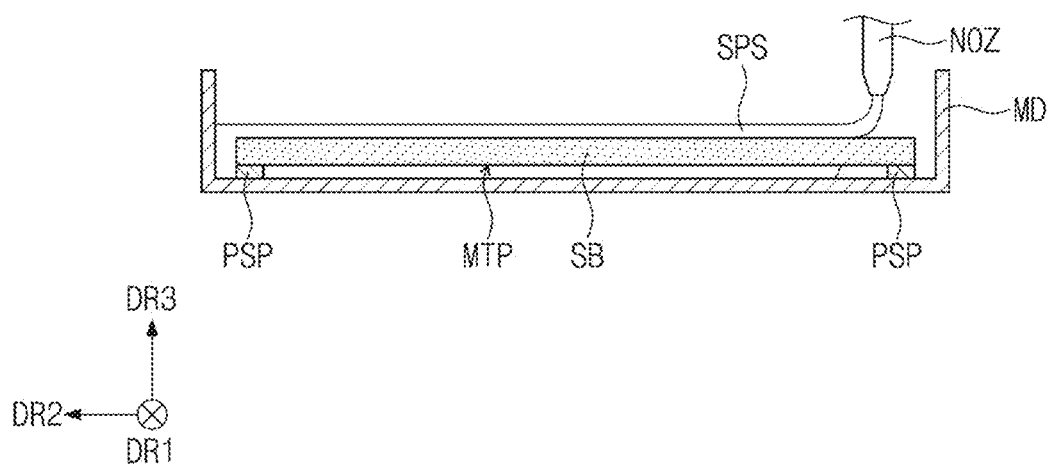
Figure 25:
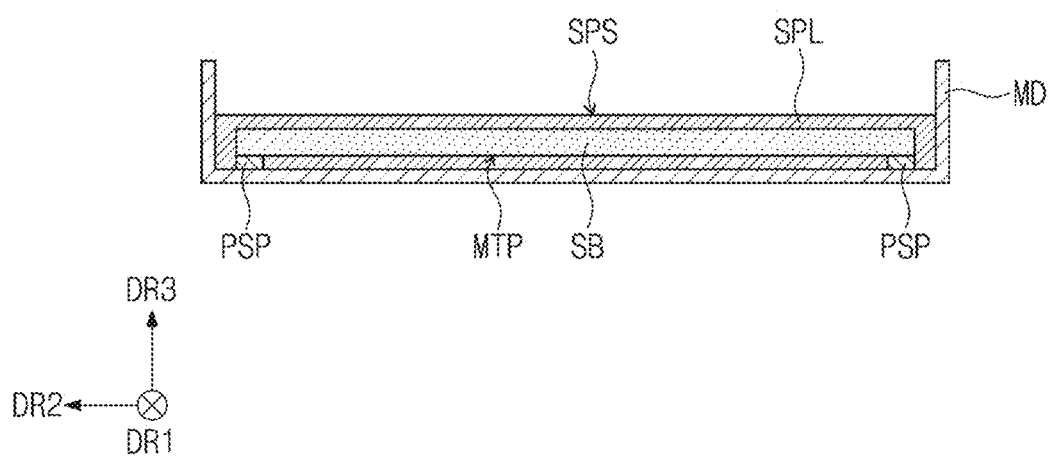
Figure 26:
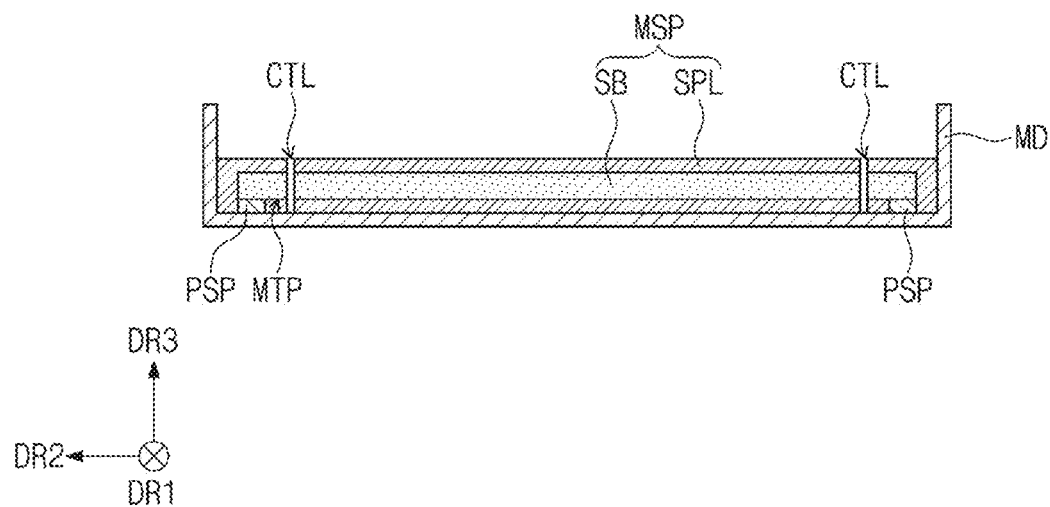

For convenience of description, FIG. 24 to FIG. 26 illustrate cross-sections viewed in the first direction DR1.

Figure 23:
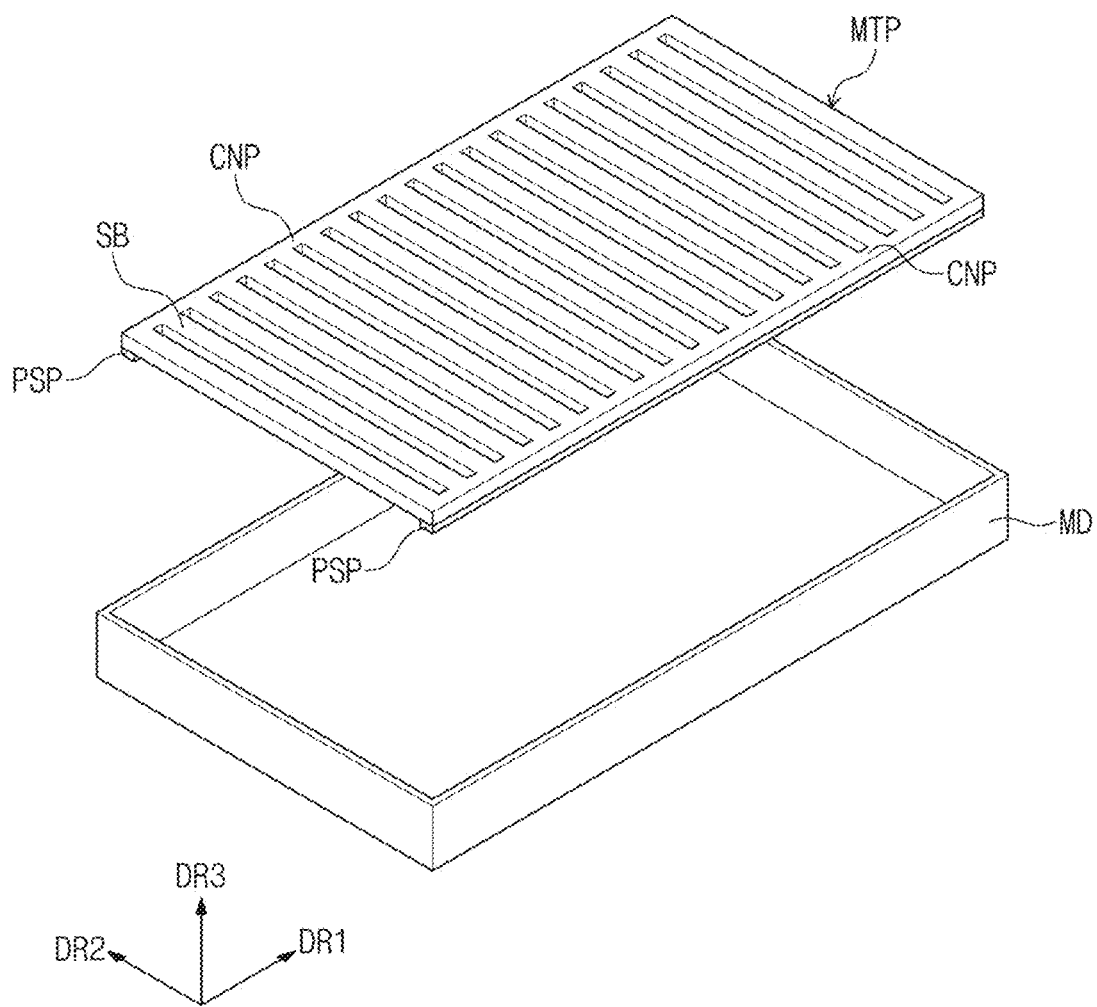
FIG. 23 to FIG. 27 are views for describing a method for manufacturing a module support according to an embodiment of the present invention.

Referring to FIG. 23, a metal plate MTP may be prepared. The metal plate MTP may include the support bars SB and connection parts CNP. The support bars SB are arranged in the first direction DR1, and may be extended in the second direction DR2. The connection parts CNP may extend in the first direction DR1 from both ends of each of the support bars SB which are opposite to each other in the second direction DR2.

Below the support bars SB, two plate supports PSP extending in the first direction DR1 and spaced apart from each other in the second direction DR2 may be disposed. Specifically, the plate supports PSP may be disposed below the connection parts CNP, respectively. The plate supports PSP may support the metal plate MTP. A mold MD for disposing the metal plate MTP and the plate supports PSP may be prepared.

Referring to FIG. 24, the metal plate MTP and the plate supports PSP may be disposed in the mold MD. To the mold MD, a suspension SPS described above with reference to FIG. 21 and FIG. 22 may be provided. The suspension SPS may be defined as a fluid resin for forming the support layer SPL.

The suspension SPS is provided to the mold MD, so that the metal plate MTP may be disposed in the suspension SPS. The suspension SPS may be filled higher than the metal plate MTP in the mold MD. Therefore, the metal plate MTP may be immersed in the suspension SPS. The suspension SPS may have low viscosity and high fluidity in order to easily penetrate between the support bars SB. For example, the suspension SPS may have a viscosity of 50 centipoise (cP) to 5000 centipoise (cP).

Referring to FIG. 25, after the suspension SPS is provided to the mold MD, the suspension SPS may be cured to form the support layer SPL.

Figure 27:
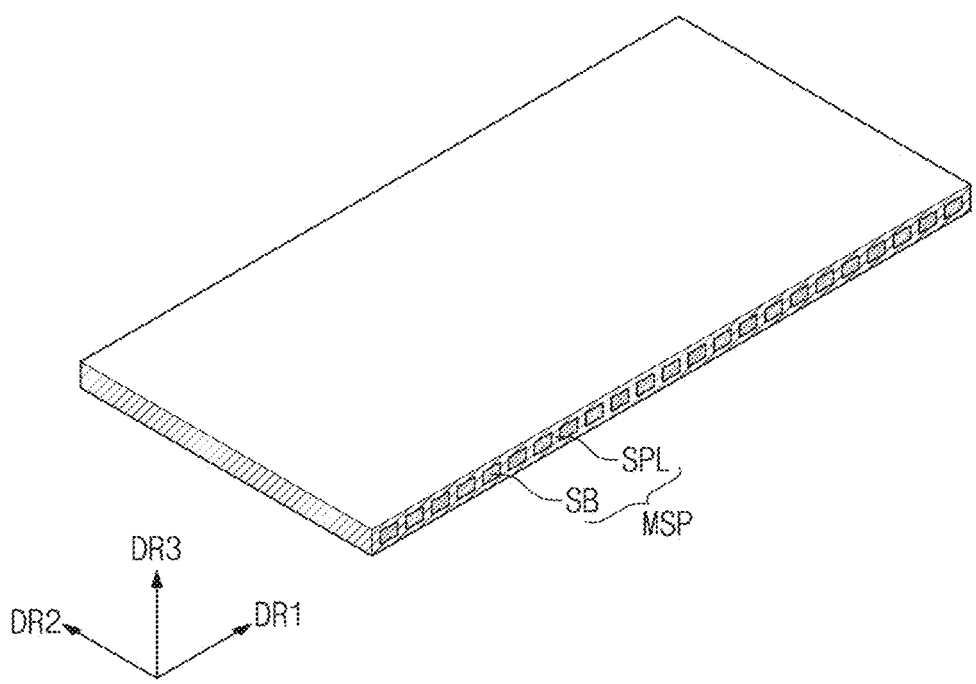

Referring to FIG. 26 and FIG. 27, the support bars SB and the support layer SPL may be cut along cutting lines CTL disposed between the plate supports PSP and adjacent to the plate supports PSP, respectively. The cutting lines CTL may extend in the first direction DR1. By the cut support bars SB and the support layer SPL, the module support MSP according to an embodiment of the present invention may be manufactured. By the manufacturing method, both ends of each of the support bars SB of the module support MSP may be exposed to the outside.

FIG. 28 to FIG. 32 are views for describing a method for manufacturing a module according to another embodiment of the present invention.

Hereinafter, focusing on a manufacturing method different from the manufacturing method of a module support described in FIG. 23 to FIG. 27, a manufacturing method of a module support illustrated in FIG. 28 to FIG. 32 will be described.

Figure 30:
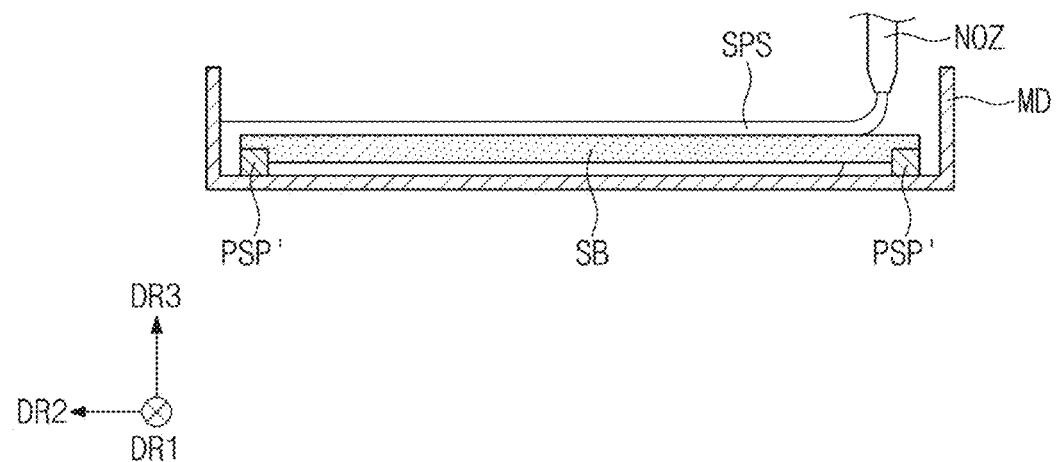
Figure 31:
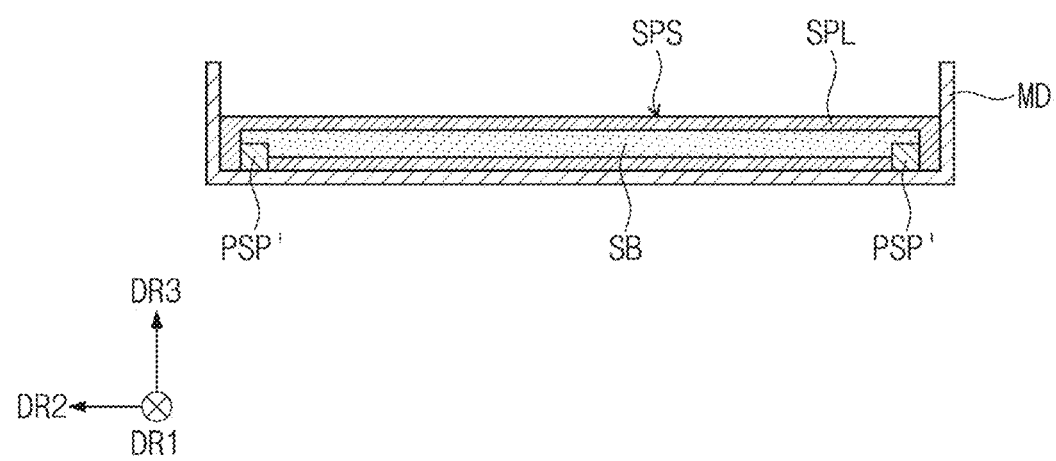
Figure 32:
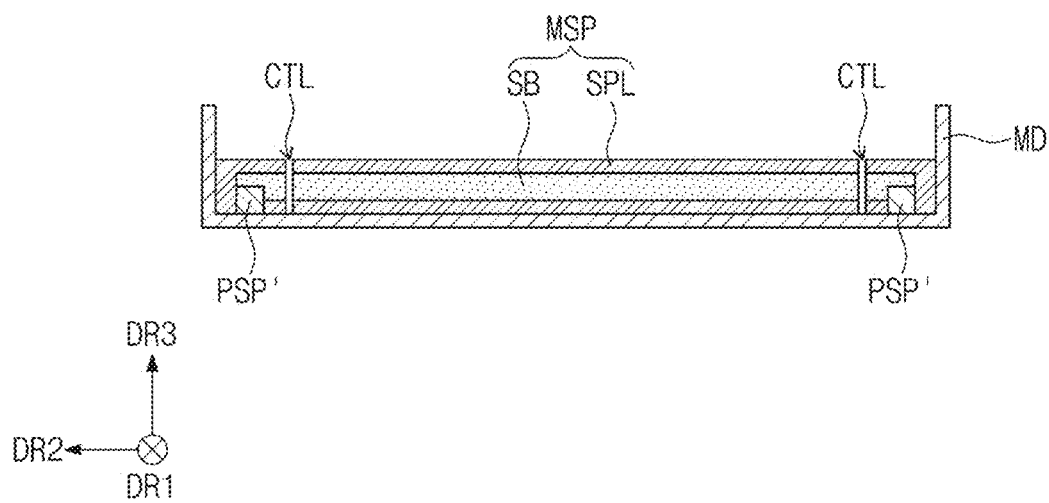

For convenience of description, FIG. 30 to FIG. 32 illustrate cross-sections viewed in the first direction DR1.

Figure 28:
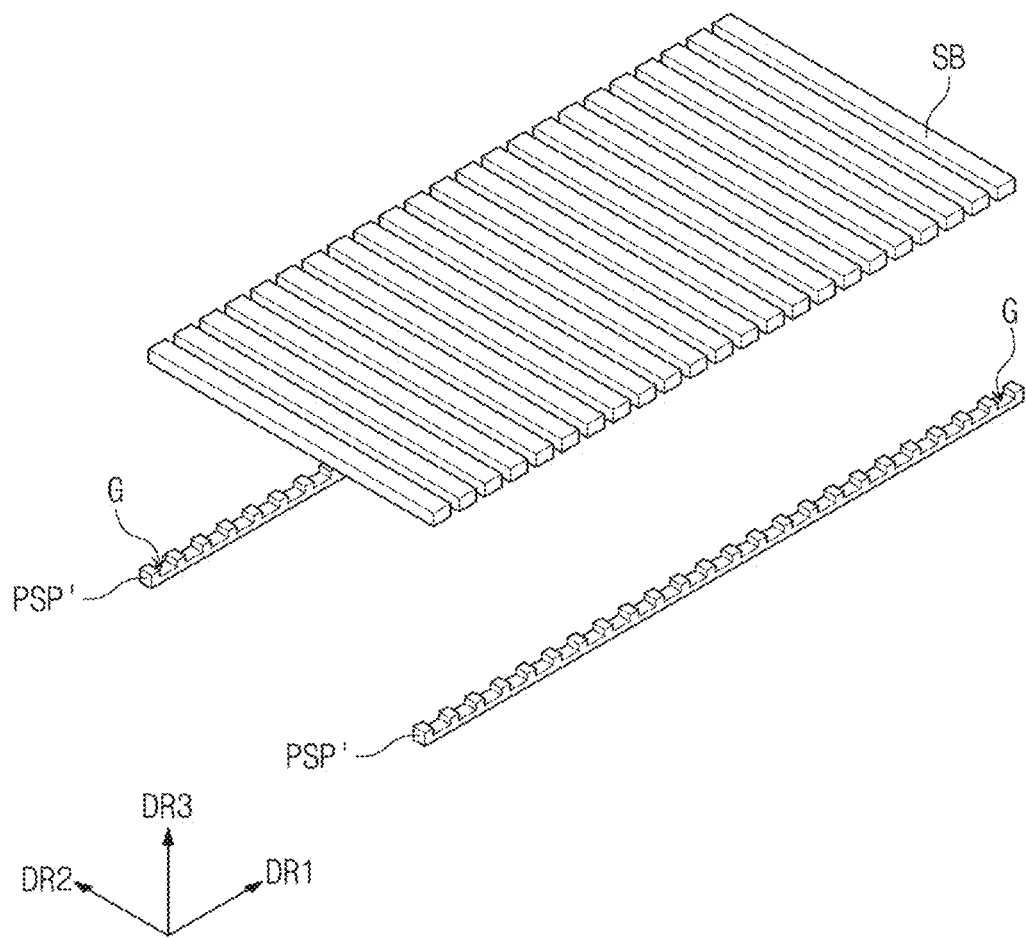
FIG. 28 to FIG. 32 are views for describing a method for manufacturing a module according to another embodiment of the present invention.
Figure 29:
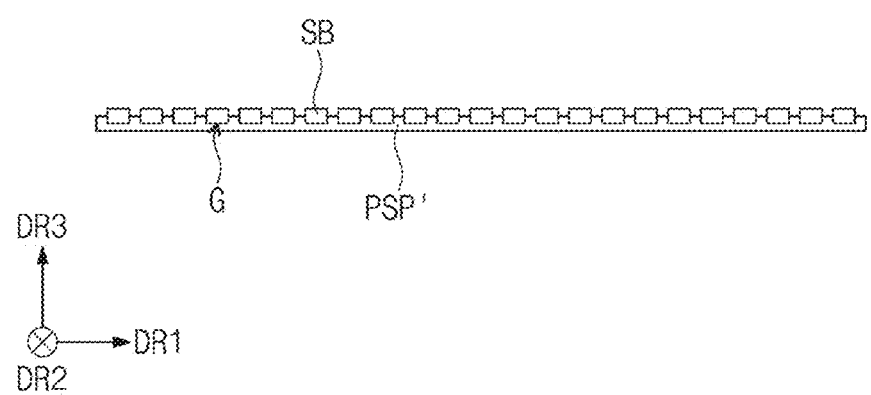

Referring to FIG. 28 and FIG. 29, below the support bars SB, two plate supports PSP' extending in the first direction DR1 and spaced apart from each other in the second direction DR2 may be disposed. In the plate supports PSP', a plate support grooves G may be defined. The grooves G may be arranged in the first direction DR1. The plate supports PSP' may support the support bars SB. Both ends of each of the support bars SB, which are opposite to each other in the second direction DR2, may be disposed in the grooves of the plate supports PSP'.

Referring to FIG. 30 to FIG. 32, the support bars SB and the plate supports PSP' are disposed in the mold MD, and the following processes may be substantially the same as the processes illustrated in FIG. 24 to FIG. 26. For example, after the suspension SPS is filled higher than the support bars SB in the mold SB, the suspension SPS may be cured to form the support layer SPL.

The support bars SB and the support layer SPL may be cut along the cutting lines CTL disposed between the plate supports PSP' and adjacent to the plate supports PSP', respectively. By the cut support bars SB and the support layer SPL, the module support MSP according to an embodiment of the present invention may be manufactured.

By the above manufacturing method, the suspension SPS may be provided to the mold MD only once to form the support layer SPL having the support bars SB disposed thereinside.

Although the present invention has been described with reference embodiments of the present invention, it will be understood by those skilled in the art that various modifications and changes in form and details may be made therein without departing from the spirit and scope of the present invention as set forth in the following claims. In addition, the embodiments disclosed in the present invention are not intended to limit the technical spirit of the present invention, and all technical concepts falling within the scope of the following claims and equivalents thereof are to be construed as being included in the scope of the present invention.

INDUSTRIAL APPLICABILITY

A technology which improves the surface quality of a display module may provide a user with higher quality images, so that the present invention has high industrial applicability.

The invention claimed is:

1. A display device comprising:
a display module;
a module support disposed below the display module; and
a housing which receives the display module and the module support, wherein
the module support includes:
a support layer disposed below the display module; and
a plurality of support bars disposed in the support layer and having a modulus greater than a modulus of the support layer.

2. The display device of claim 1, wherein the support layer comprises an elastomer.

3. The display device of claim 1, wherein the plurality of support bars comprises a metal.

4. The display device of claim 1, wherein the modulus of the support layer is 20 kilopascals to 20 megapascals, and the modulus of the plurality of support bars is 1 gigapascal to 200 gigapascals.

5. The display device of claim 1, wherein the support layer comprises:
a support film including an elastomer; and
a material contained in the support film and having a negative coefficient of thermal expansion.

6. The display device of claim 1, wherein the display module extends in a first direction, and the plurality of support bars extend in a second direction crossing the first direction and are arranged in the first direction.

7. The display device of claim 6, wherein both ends of each of the plurality of support bars, which are opposite to each other in the second direction, are exposed to the outside of the support layer.

8. The display device of claim 6, wherein when viewed in the second direction, each of the plurality of support bars has a quadrangular, inverted trapezoidal, inverted triangular, or circular shape.

9. The display device of claim 6, wherein the plurality of support bars comprises:
a plurality of first support bars; and
a plurality of second support bars alternately disposed with the plurality of first support bars in the first direction,
wherein the plurality of second support bars are disposed at a different height from the plurality of first support bars from a lower surface of the support layer.

10. The display device of claim 9, wherein:
an upper surface of each of the plurality of second support bars is disposed between an upper surface and a lower surface of each of the plurality of first support bars;
a lower surface of each of the plurality of second support bars is disposed lower than the lower surface of each of the plurality of first support bars; and
when viewed on a plane, the plurality of first support bars partially overlap the plurality of second support bars.

11. The display device of claim 9, wherein when viewed in the second direction, the plurality of first support bars have reverse shapes with respect to shapes of the plurality of second support bars.

12. The display device of claim 9, wherein a proportion of a region in which the plurality of first and second support bars are disposed on a cross-section of the module support is uniform.

13. The display device of claim 6, further comprising a first support and a second support which extend in the first direction, and spaced apart from each other in the second direction,
wherein the first support and the second support both sides of the module support which are opposite to each other in the second direction, and the display module is disposed between the first support and the second support.

14. The display device of claim 13, wherein the both sides of the module support are in guide grooves, respectively, and the guide grooves are defined on an inner side surface of the first support and on an inner side surface of the second support respectively, and face each other.

15. The display device of claim 13, wherein when the display module and the module support are drawn out of the housing, the first support and the second support are extended to the outside of the housing.

16. The display device of claim 1, further comprising
a roller in the housing, and connected to one end of the display module and one end of the module support to wind the display module and the module support.

17. A display device comprising:
a display module; and
a module support disposed below the display module, wherein the module support includes:
a support layer disposed below the display module; and
a plurality of support bars arranged in a first direction in the support layer,
wherein the support layer includes a material having a negative coefficient of thermal expansion.

18. The display device of claim 17, wherein the material having the negative coefficient of thermal expansion comprises at least one among $ZrW_2O_8$, $ZrV_2O_2$, $Ag_3Co(CN)_6$, and $Sc_2(WO_4)_3$.

19. The display device of claim 17, wherein the support layer further comprises a support film, and the material having the negative coefficient of thermal expansion is contained in the support film.

20. The display device of claim 19, wherein the support film comprises at least one among thermoplastic polyurethane, silicone, thermoplastic rubbers, elastolefin, thermoplastic olefin, polyamide, polyether block amide, synthetic polyisoprene, polybutadiene, chloroprene rubber, butyl rubber, styrene-butadiene, epichlorohydrin rubber, polyacrylic rubber, silicone rubber, fluorosilicone rubber, fluoroelastomers, and ethylene-vinyl acetate.

21. The display device of claim 17, wherein the plurality of support bars comprise:
a plurality of first support bars; and a plurality of second support bars alternately disposed with the plurality of first support bars in the first direction, wherein the plurality of second support bars are disposed at a different height from the plurality of first support bars from a lower surface of the support layer, and when viewed on a plane, the plurality of first support bars partially overlap the plurality of second support bars.

22. The display device of claim 21, wherein:

when viewed in the second direction, the plurality of first support bars have reverse shapes with respect to shapes of the plurality of second support bars; and a proportion of a region in which the plurality of first and second support bars are disposed on a cross-section of the module support is uniform.

* * * * *